(12) United States Patent
Kikuchi et al.

(10) Patent No.: US 10,157,578 B2
(45) Date of Patent: Dec. 18, 2018

(54) LIGHT EMITTING DEVICE DRIVING CIRCUIT, DISPLAY, AND A/D CONVERSION CIRCUIT

(71) Applicant: Sony Corporation, Tokyo (JP)

(72) Inventors: Ken Kikuchi, Tokyo (JP); Hisao Sakurai, Saitama (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 125 days.

(21) Appl. No.: 15/116,608

(22) PCT Filed: Feb. 2, 2015

(86) PCT No.: PCT/JP2015/052862
§ 371 (c)(1),
(2) Date: Aug. 4, 2016

(87) PCT Pub. No.: WO2015/122305
PCT Pub. Date: Aug. 20, 2015

(65) Prior Publication Data
US 2016/0351130 A1     Dec. 1, 2016

(30) Foreign Application Priority Data
Feb. 13, 2014 (JP) .................................. 2014-025048

(51) Int. Cl.
    *H03M 1/66*      (2006.01)
    *G09G 3/3275*    (2016.01)
    (Continued)

(52) U.S. Cl.
    CPC ......... *G09G 3/3275* (2013.01); *G09G 3/2014* (2013.01); *G09G 3/3233* (2013.01);
    (Continued)

(58) Field of Classification Search
    CPC ............................ H03M 1/1014; H02M 3/156
    (Continued)

(56) References Cited

U.S. PATENT DOCUMENTS

2004/0207614 A1    10/2004   Yamashita et al.
2006/0038510 A1*   2/2006   Lee ....................... H02M 3/156
                                                             315/291

(Continued)

FOREIGN PATENT DOCUMENTS

| JP | 2003-043999 A | 2/2003 |
|---|---|---|
| JP | 2003-223136 A | 8/2003 |
| JP | 2004-510208 A | 4/2004 |
| JP | 2004-246320 A | 9/2004 |
| JP | 2007-253501 A | 10/2007 |
| JP | 2008-096794 A | 4/2008 |

OTHER PUBLICATIONS

Written Opinion and English translation thereof dated Apr. 14, 2015 in connection with International Application No. PCT/JP2015/052862.

(Continued)

*Primary Examiner* — Abdul-Samad A Adediran
(74) *Attorney, Agent, or Firm* — Wolf, Greenfield & Sacks, P.C.

(57) ABSTRACT

A light emitting device driving circuit according to the present disclosure includes a sawtooth waveform generating unit for generating a sawtooth waveform voltage having a sawtooth waveform voltage change based on at least two reference signals to be input and a comparison unit for comparing an analog signal voltage with the sawtooth waveform voltage. The light emitting device driving circuit drives a light emitting device based on the comparison result of the comparison unit. Accordingly, a comparison operation using a sawtooth waveform voltage having a waveform which is not disturbed is performed.

13 Claims, 12 Drawing Sheets

(51) Int. Cl.
*H03M 1/10* (2006.01)
*H03M 1/18* (2006.01)
*H03M 1/34* (2006.01)
*G09G 3/20* (2006.01)
*G09G 3/3233* (2016.01)
*H03M 1/56* (2006.01)
*H03M 1/12* (2006.01)

(52) U.S. Cl.
CPC ........... *H03M 1/1014* (2013.01); *H03M 1/18* (2013.01); *H03M 1/34* (2013.01); *G09G 2310/066* (2013.01); *G09G 2320/0233* (2013.01); *G09G 2330/028* (2013.01); *H03M 1/123* (2013.01); *H03M 1/56* (2013.01)

(58) Field of Classification Search
USPC ............................................ 315/291; 341/44
See application file for complete search history.

(56) References Cited

U.S. PATENT DOCUMENTS

2007/0194962 A1* 8/2007 Asayama ............ H03M 1/1014
341/144
2008/0100543 A1 5/2008 Kasai et al.

OTHER PUBLICATIONS

International Preliminary Report on Patentability and English translation thereof dated Aug. 25, 2016 in connection with International Application No. PCT/JP2015/052862.

* cited by examiner

LIGHT EMITTING DEVICE DRIVING CIRCUIT, DISPLAY, AND A/D CONVERSION CIRCUIT

CROSS REFERENCE TO RELATED APPLICATIONS

This Application is a national stage filing under 35 U.S.C. 371 of International Patent Application Serial No. PCT/JP2015/052862, filed Feb. 2, 2015, entitled "LIGHT EMITTING DEVICE DRIVING CIRCUIT, DISPLAY, AND A/D CONVERSION CIRCUIT". Foreign priority benefits are claimed under 35 U.S.C. § 119(a)-(d) or 35 U.S.C. § 365(b) of Japanese application number JP 2014-025048, filed Feb. 13, 2014. The entire contents of these applications are incorporated herein by reference in their entirety.

TECHNICAL FIELD

The present disclosure relates to a light emitting device driving circuit, a display, and an A/D conversion circuit.

BACKGROUND ART

Alight emitting diode display which uses a light emitting diode (LED) as a light emitting unit (light emitting device) has been actively developed. In the light emitting diode display, a light emitting unit formed of a red light emitting diode functions as a red light emitting sub-pixel, and a light emitting unit formed of a green light emitting diode functions as a green light emitting sub-pixel. Also, a light emitting unit formed of a blue light emitting diode functions as a blue light emitting sub-pixel. A color image is displayed according to the light emitting states of the three kinds of sub-pixels.

Also, an organic EL display for using an organic electro luminescence (EL) element as the light emitting unit has been known. In the organic EL display, as a drive circuit for driving the light emitting unit, a variable constant current driving method of which a light emission duty is fixed has been widely used. Also, in order to reduce unevenness of light emission, the organic EL display has used a pulse width modulation (PWM) method (for example, refer to Patent Document 1). In the PWM driving method, a sawtooth waveform voltage having a sawtooth waveform (ramp waveform) voltage change is used, and the sawtooth waveform voltage is compared with an analog video signal voltage. Then, a light emitting period of the light emitting unit (light emitting element) is determined based on the comparison result.

CITATION LIST

Patent Document

Patent Document 1: Japanese Patent Application Laid-Open No. 2003-223136

SUMMARY OF THE INVENTION

Problems to be Solved by the Invention

When a structure is employed in which the sawtooth waveform voltage is input from outside to a light emitting device driving circuit, there is a case where a waveform of the sawtooth waveform voltage is disturbed by an influence of an impedance of wiring for transmitting the sawtooth waveform voltage. When the light emitting device is driven by using the PWM driving method, especially, the waveform of a front end part of the sawtooth waveform voltage, that is, a part where sharpness is required for low-gradation display is disturbed. Then, a luminance and a chromaticity are not accurately displayed relative to the same video signal voltage, and display unevenness is generated.

Here, a problem caused by the distortion of the waveform of the sawtooth waveform voltage has been described by using the light emitting device driving circuit for driving the light emitting device by using the PWM driving method as an example. However, the problem is not limited to that in a case of the light emitting device driving circuit. For example, the problem can occur in an A/D conversion circuit which converts an analog signal into a digital signal by performing a comparison operation with the analog signal by using the sawtooth waveform voltage.

A purpose of the present disclosure is to provide a light emitting device driving circuit which can perform a comparison operation by using a sawtooth waveform voltage having a waveform which is not disturbed, a display for using the light emitting device driving circuit, and an A/D conversion circuit.

Solutions to Problems

The light emitting device driving circuit according to the present disclosure to achieve the purpose includes a sawtooth waveform generating unit for generating a sawtooth waveform voltage having a sawtooth waveform voltage change based on at least two reference signals to be input and a comparison unit for comparing an analog signal voltage with the sawtooth waveform voltage. The light emitting device driving circuit drives a light emitting device based on the comparison result of the comparison unit.

The display according to the present disclosure to achieve the purpose includes a plurality of pixels including a light emitting unit and a drive circuit for driving the light emitting unit and arranged in a two-dimensional matrix state. The drive circuit includes a sawtooth waveform generating unit which generates a sawtooth waveform voltage having a sawtooth waveform voltage change based on at least two reference signals to be input and a comparison unit which compares an analog signal voltage with the sawtooth waveform voltage. The drive circuit drives the light emitting unit based on the comparison result of the comparison unit.

The A/D conversion circuit according to the present disclosure to achieve the purpose includes a sawtooth waveform generating unit for generating a sawtooth waveform voltage having a sawtooth waveform voltage change based on at least two reference signals to be input and a comparison unit for comparing an analog signal voltage with the sawtooth waveform voltage. The A/D conversion circuit generates a digital signal based on the comparison result of the comparison unit.

The light emitting device driving circuit, the display, or the A/D conversion circuit having the above structures includes the sawtooth waveform generating unit for generating the sawtooth waveform voltage so that it is not necessary to transmit the sawtooth waveform voltage via the transmission wiring and input it. Accordingly, the distortion of the waveform of the sawtooth waveform voltage is not generated by the influence of the impedance of the transmission wiring and the like, and the sawtooth waveform voltage generated inside, that is, the sawtooth waveform voltage having the waveform which is not disturbed can be used as the comparison reference input of the comparison unit.

Effects of the Invention

According to the present disclosure, since the sawtooth waveform voltage generated inside can be used as the comparison reference input of the comparison unit, the comparison operation for using the sawtooth waveform voltage having the waveform which is not disturbed can be performed.

The effects are not limited to the above, and the effect may be any effects described herein. Also, the effects described herein are only exemplary and not limited to these. Also, there may be an additional effect.

BRIEF DESCRIPTION OF DRAWINGS

FIG. 9 is a schematic diagram to describe a distortion of a waveform of a sawtooth waveform voltage caused by an influence of an impedance of transmission wiring and the like.

MODE FOR CARRYING OUT THE INVENTION

Figure 1A:
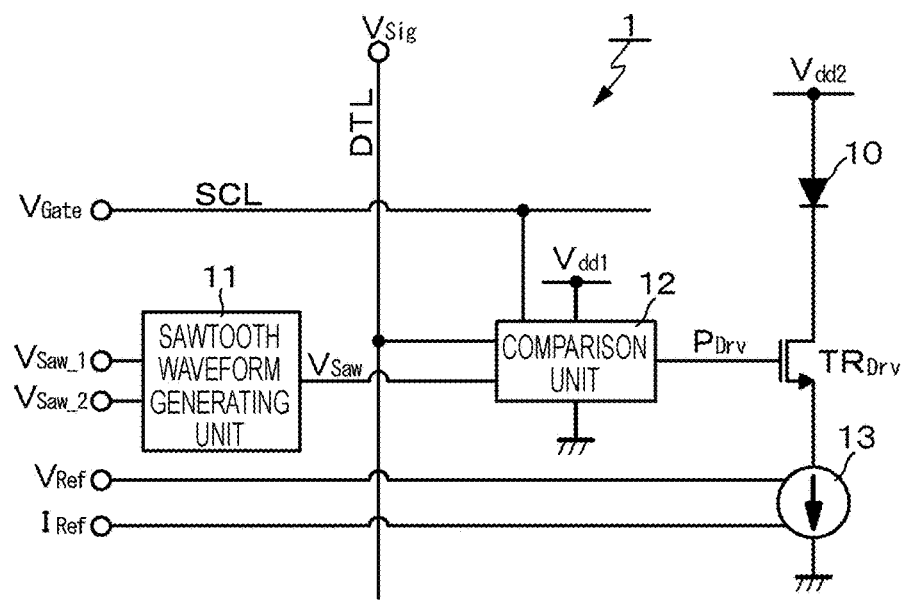
FIG. 1A is a circuit diagram of a structure of a light emitting device driving circuit according to a first embodiment of the present disclosure.

Embodiments of the present disclosure are described in detail below with reference to the drawings. A technique of the present disclosure is not limited to the embodiments, and various values in the embodiments are only exemplary. In the following description, the same elements or elements having the same functions are denoted with the same reference numerals, and overlapped description is omitted. The description is made in the following order.

1. Description on light emitting device driving circuit, display, and A/D conversion circuit according to the present disclosure 2. First embodiment (example of light emitting device driving circuit)

3. Second embodiment (example of display)

4. Third embodiment (example of solid-state imaging device using column parallel A/D conversion system)

<Description on Light Emitting Device Driving Circuit, Display, and A/D Conversion Circuit According to the Present Disclosure>

A light emitting device driving circuit, a display, and an A/D conversion circuit according to the present disclosure can use a sawtooth waveform signal, of which a voltage is changed more gently than the sawtooth waveform voltage, as at least two reference signals.

The light emitting device driving circuit, the display, and the A/D conversion circuit according to the present disclosure including the above-described preferred structure can use the at least two reference signals having frequencies lower than that of the sawtooth waveform voltage. Also, at least two reference signals can have the signal forms having the same frequencies. At this time, the two reference signals are signals having similar forms in which a waveform is inverted in a time axis direction. Partial waveforms can be overlapped with each other.

In the light emitting device driving circuit, the display, and the A/D conversion circuit according to the present disclosure including the above-described preferred structure and form, a sawtooth waveform generating unit can generate a sawtooth waveform voltage based on overlapped sharp waveform parts of the two reference signals. Also, the sawtooth waveform generating unit can include a differential circuit which takes a difference between the two reference signals and a cut-off unit. The cut-off unit cuts off a waveform part of one of the two reference signals based on an in-phase signal as one of the output signals of the differential circuit and cuts off a waveform part of another one of two reference signals based on a reversed-phase signal of the one of the output signals of the differential circuit. At this time, the cut-off unit cuts off sharp waveform parts of the two reference signals, and the two waveform parts which are cut off by the cut-off unit are synthesized and form the sawtooth waveform voltage.

In the display according to the present disclosure including the above-described preferred structure and form, a plurality of pixels is arranged in a two-dimensional matrix state in a first direction and a second direction. In the pixel array, a pixel group arranged along the first direction is referred to as a "column direction pixel group", and a pixel group arranged in the second direction is referred to as a "row direction pixel group". When it is assumed that the first direction be the vertical direction of the display and that the second direction be the horizontal direction of the display, the column direction pixel group indicates a pixel group arranged in the vertical direction, and the row direction pixel group indicates a pixel group arranged in the horizontal direction.

Also, the display according to the present disclosure including the above-described preferred structure and form can include a first input terminal which inputs one of the two reference signals when the sawtooth waveform voltage is generated and a second input terminal which inputs a predetermined voltage when an analog signal voltage is written and inputs another one of the two reference signals when the sawtooth waveform voltage is generated. At this time, the predetermined voltage can be a voltage which is not used when the light emitting unit emits light. Also, when the drive circuit has the constant current source unit which supplies a constant current to the light emitting unit, the predetermined voltage can be a reference voltage which is used by the constant current source unit to determine the constant current.

Also, in the display according to the present disclosure including the above-described preferred structure and form, the light emitting unit can be formed of a light emitting diode (LED). The light emitting diode can be a light emitting diode having a known structure and configuration. That is, it is preferable to select a light emitting diode which has an optimal structure and configuration and formed of an appropriate material based on a light emission color of the light emitting diode. In the display for using the light emitting diode as the light emitting unit, a light emitting unit formed of a red light emitting diode functions as a red light emitting sub-pixel, and a light emitting unit formed of a green light emitting diode functions as a green light emitting sub-pixel. A light emitting unit formed of a blue light emitting diode functions as a blue light emitting sub-pixel. The three kinds of sub-pixels form a single pixel, and a color image can be displayed according to light emitting states of the three kinds of sub-pixels.

The "single pixel" in the present disclosure corresponds to the "single sub-pixel" in the display. Therefore, the "single sub-pixel" in the display may be understood as the "single pixel". When the three kinds of sub-pixels form the single pixel, a delta array, a stripe array, a diagonal array, and a rectangle array can be exemplified as an array of the three kinds of sub-pixels. The light emitting diode is driven at the constant current based on a PWM driving method so that generation of a blue shift in a spectrum wavelength of the light emitting diode can be prevented. Also, three panels are prepared first. A first panel is configured of a light emitting unit formed of the red light emitting diode, and a second panel is configured of a light emitting unit formed of the green light emitting diode, and a third panel is configured of a light emitting unit formed of the blue light emitting diode. Then, for example, light beams from the three panels can be applied to a projector which collects these light beams by using a dichroic prism.

First Embodiment

Figure 1B:
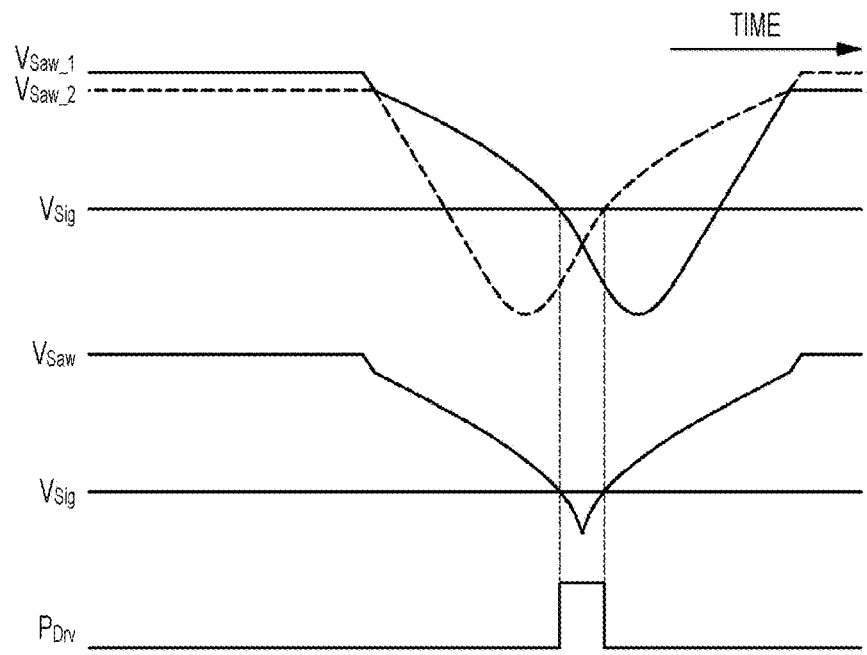
FIG. 1B is a waveform diagram of signal waveforms of respective parts of the light emitting device driving circuit according to the first embodiment.

FIG. 1A is a circuit diagram of a structure of a light emitting device driving circuit according to a first embodiment of the present disclosure. FIG. 1B illustrates signal waveforms of respective parts of the light emitting device driving circuit according to the first embodiment.

As illustrated in FIG. 1A, a light emitting device driving circuit 1 according to the first embodiment includes a sawtooth waveform generating unit 11, a comparison unit 12, a light emitting unit driving transistor $TR_{Drv}$, and a constant current source unit 13 and drives a light emitting unit 10. The light emitting unit 10 is formed of a light emitting diode (LED). For example, two reference signals $V_{Saw\_1}$ and $V_{Saw\_2}$ to be the base of the generation of a sawtooth waveform voltage $V_{Saw}$ are input to the sawtooth waveform generating unit 11. The sawtooth waveform generating unit 11 generates the sawtooth waveform voltage $V_{Saw}$ based on the two reference signals $V_{Saw\_1}$ and $V_{Saw\_2}$ to be input. The sawtooth waveform voltage $V_{Saw}$ has a sawtooth waveform (sawtooth waveform/ramp waveform) voltage change.

As illustrated in FIG. 1B, the sawtooth waveform voltage $V_{Saw}$ has a waveform having a sharp front end part. The two reference signals $V_{Saw\_1}$ and $V_{Saw\_2}$ to be the base of the generation of the sawtooth waveform voltage $V_{Saw}$ are sawtooth waveform signals of which voltages are more gently changed than the sawtooth waveform voltage $V_{Saw}$. More specifically, each of the two reference signals $V_{Saw\_1}$ and $V_{Saw\_2}$ can be the sawtooth waveform signal having a frequency lower than that of the sawtooth waveform voltage $V_{Saw}$. At this time, it is preferable that the two reference signals $V_{Saw\_1}$ and $V_{Saw\_2}$ have the same frequencies.

Also, as illustrated in FIG. 1B, it is preferable that the two reference signals $V_{Saw\_1}$ and $V_{Saw\_2}$ be signals having similar forms in which a waveform is inverted in the time axis direction. At this time, it is assumed that partial waveforms of the two reference signals $V_{Saw\_1}$ and $V_{Saw\_2}$ be overlapped with each other as illustrated in FIG. 1B. The "similar form" here includes a strictly similar form and a substantially similar form. Variations generated in designing or manufacturing can be allowed.

The sawtooth waveform generating unit 11 to which the two reference signals $V_{Saw\_1}$ and $V_{Saw\_2}$ are input generates the sawtooth waveform voltage $V_{Saw}$ based on the sharp waveform parts of the two reference signals $V_{Saw\_1}$ and $V_{Saw\_2}$ overlapped with each other. In FIG. 1B, the reference signal $V_{Saw\_1}$ is indicated by a solid line, and the reference signal $V_{Saw\_2}$ is indicated by a broken line. Therefore, the sharp waveform part, that is, the sawtooth waveform voltage $V_{Saw}$ includes an overlapped solid line part of the reference signal $V_{Saw\_1}$ and an overlapped broken line part of the reference signal $V_{Saw\_2}$. The sawtooth waveform voltage $V_{Saw}$ generated by the sawtooth waveform generating unit 11 is applied to the comparison unit 12 as a comparison reference input.

The comparison unit 12 includes a comparator circuit and has a power supply $V_{dd}$ ($V_{dd1}$) on the high potential side and a power supply on the low potential side (for example, ground GND) as an operation power supply. The comparator circuit included in the comparison unit 12 may be any kind of comparator circuit, and for example, a chopper-type comparator circuit including a differential circuit unit for detecting a difference between two input signals and a differential comparator circuit can be exemplified. A specific circuit structure of the comparison unit 12 is described below.

The comparison unit 12 takes in a signal voltage $V_{Sig}$ of an analog video signal supplied via a data line DTL by synchronizing it with a scanning signal $V_{Gate}$ applied via a scanning line SCL as a comparison input. The comparison unit 12 compares the signal voltage $V_{Sig}$ of the video signal which is the comparison input with the sawtooth waveform voltage $V_{Saw}$ which is applied from the sawtooth waveform generating unit 11 as the comparison reference input. The comparison unit 12 outputs a driving pulse $P_{Drv}$ having a pulse width according to the magnitude of the signal voltage $V_{Sig}$ as the comparison result.

The light emitting unit 10 to be driven by the light emitting device driving circuit 1, the light emitting unit driving transistor $TR_{Drv}$, and the constant current source unit 13 are connected in series between the power supply $V_{dd}$ ($V_{dd2}$) on the high potential side and the power supply (for example, ground GND) on the low potential side. The light emitting unit driving transistor $TR_{Drv}$ is, for example, formed of an N channel field effect transistor. However, the light emitting unit driving transistor $TR_{Drv}$ is not limited to the N channel field effect transistor. The constant current source unit 13 supplies the constant current to the light emitting unit driving transistor $TR_{Drv}$. The light emitting unit driving transistor $TR_{Drv}$ is in a conductive state over a period of the pulse width of the driving pulse $P_{Drv}$ by supplying the high-level driving pulse $P_{Drv}$ from the comparison unit 12 to a gate electrode and supplies a drive current to the light emitting unit 10. According to this, the light emitting unit 10 emits light over the period of the pulse width of the driving pulse $P_{Drv}$.

In this way, the light emitting device driving circuit 1 according to the first embodiment employs the PWM driving method. In the PWM driving method, when the light emitting unit 10 to be driven is formed of the light emitting diode, the signal voltage $V_{Sig}$ of the video signal is compared with the sawtooth waveform voltage $V_{Saw}$, and a light emitting period of the light emitting diode is determined based on the comparison result.

In the light emitting diode, the blue shift is generated in the spectrum wavelength due to an increase in the amount of the drive current, and an emission wavelength is changed. Therefore, variable constant current drive has a difficulty such that a monochrome chromaticity point is changed according to a luminance (amount of drive current). From these viewpoints, when the light emitting diode is used as the light emitting unit 10, it is important to drive the light emitting diode based on the PWM driving method.

As described above, the light emitting device driving circuit 1 according to the first embodiment does not input the sawtooth waveform voltage $V_{Saw}$ from outside and includes the sawtooth waveform generating unit 11 for generating the sawtooth waveform voltage $V_{Saw}$ based on the two reference signals $V_{Saw\_1}$ and $V_{Saw\_2}$ input from outside. In the present embodiment, a case has been described where the number of sawtooth waveform reference signals to be the base to generate the sawtooth waveform voltage $V_{Saw}$ is two. However, the number of reference signals is not limited to two and may be equal to or more than three.

When the sawtooth waveform voltage $V_{Saw}$ is input to the light emitting device driving circuit 1 from outside, there is a case where the waveform of the sawtooth waveform voltage $V_{Saw}$ is disturbed by an influence of an impedance of wiring for transmitting the sawtooth waveform voltage $V_{Saw}$. When the light emitting unit 10 is driven by using the PWM driving method, the luminance and the chromaticity are not accurately displayed relative to the same signal voltage $V_{Sig}$ in a case where the waveform of the front end part of the sawtooth waveform voltage $V_{Saw}$ is disturbed. The front end part of the sawtooth waveform voltage $V_{Saw}$ is a part of the waveform where sharpness is required for low-gradation display.

Whereas, the light emitting device driving circuit 1 according to the first embodiment includes the sawtooth waveform generating unit 11 for generating the sawtooth waveform voltage $V_{Saw}$ so that it is not necessary to transmit the sawtooth waveform voltage $V_{Saw}$. As a result, the distortion of the waveform in the front end part of the sawtooth waveform voltage $V_{Saw}$ caused by the influence of the impedance of the transmission wiring can be prevented. Therefore, in the PWM driving method, since the light emitting unit 10 can be driven by the driving pulse $P_{Drv}$ having the pulse width accurately corresponding to the magnitude of the signal voltage $V_{Sig}$ of the video signal, the luminance and the chromaticity accurately corresponding to the magnitude of the signal voltage $V_{Sig}$ can be displayed.

On the other hand, the two reference signals $V_{Saw\_1}$ and $V_{Saw\_2}$ to be the base to generate the sawtooth waveform voltage $V_{Saw}$ are input to the light emitting device driving circuit 1 from outside. The two reference signals $V_{Saw\_1}$ and $V_{Saw\_2}$ are sawtooth waveform signals of which the voltages are more gently changed than the sawtooth waveform voltage $V_{Saw}$, that is, signals closer to sine waves than the sawtooth waveform voltage $V_{Saw}$. In other words, the sawtooth waveform voltage $V_{Saw}$ has many harmonic components. Whereas, the reference signals $V_{Saw\_1}$ and $V_{Saw\_2}$ have fewer harmonic components than the sawtooth waveform voltage $V_{Saw}$. Therefore, compared with the transmission of the sawtooth waveform voltage $V_{Saw}$ via the transmission wiring, the transmission of the reference signals $V_{Saw\_1}$ and $V_{Saw\_2}$ can prevent the distortion of the waveform caused by the influence of the impedance of the transmission wiring and the like.

This indicates that a case where the PWM drive is performed by using the sawtooth waveform voltage $V_{Saw}$ generated by the built-in sawtooth waveform generating unit 11 is better than a case where PWM drive is performed by using the sawtooth waveform voltage $V_{Saw}$ input from outside for the light emitting device driving circuit 1 which employs the PWM driving method.

(Exemplary Circuit Structure of Sawtooth Waveform Generating Unit)

Figure 2:
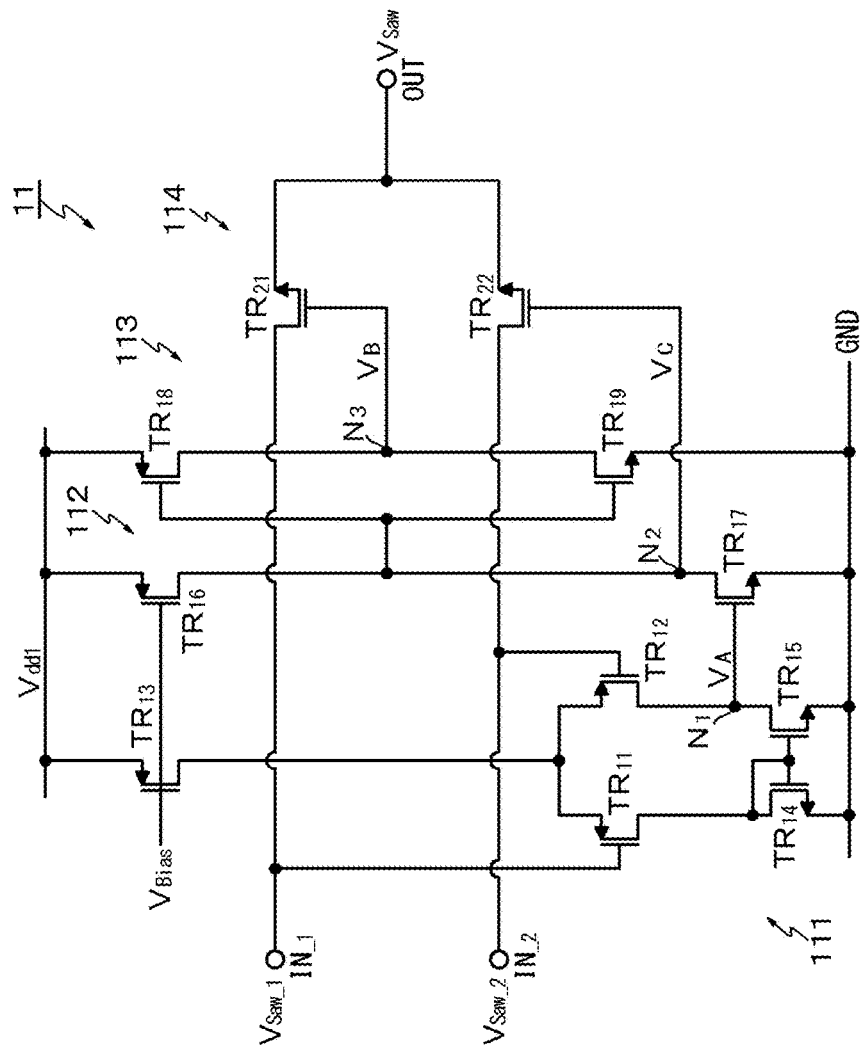
FIG. 2 is a circuit diagram of an exemplary circuit structure of a sawtooth waveform generating unit.

Subsequently, a specific circuit structure of the sawtooth waveform generating unit 11 for generating the sawtooth waveform voltage $V_{Saw}$ is described. FIG. 2 is a circuit diagram of an exemplary circuit structure of the sawtooth waveform generating unit 11. The sawtooth waveform generating unit 11 according to the present example includes a differential circuit 111, two-stage inverter circuits 112 and 113, and a cut-off unit 114.

The differential circuit 111 includes a differential pair transistor, a current source transistor, and an active load. The differential pair transistor includes two P channel field effect transistors $TR_{11}$ and $TR_{12}$ of which source electrodes are commonly connected and which operate a differential operation. The current source transistor includes a P channel field effect transistor $TR_{13}$ connected between the power supply $V_{dd1}$ on the high potential side and a source common connection node of the differential pair transistors $TR_{11}$ and $TR_{12}$. A predetermined bias voltage $V_{Bias}$ is applied to a gate electrode of the P channel field effect transistor $TR_{13}$.

The active load includes two N channel field effect transistors $TR_{14}$ and $TR_{15}$ which form a current mirror circuit. Specifically, both a drain electrode and a gate electrode of the N channel field effect transistor $TR_{14}$ are connected to a drain electrode of the P channel field effect transistor $TR_{11}$, and a source electrode is connected to the power supply GND on the low potential side. A gate electrode of the N channel field effect transistor $TR_{15}$ is connected to the gate electrode of the N channel field effect transistor $TR_{14}$, and a drain electrode is connected to a drain electrode of the P channel field effect transistor $TR_{12}$. A source electrode is connected to the power supply GND on the low potential side.

In the differential circuit 111 having the above structure, a gate electrode of the P channel field effect transistor $TR_{11}$ is one input end, and the reference signal $V_{Saw\_1}$ which is supplied via a circuit input terminal $IN\_1$ is input to the gate electrode. Also, the gate electrode of the P channel field effect transistor $TR_{12}$ is another input end, and the reference signal $V_{Saw\_2}$ which is supplied via a circuit input terminal $IN\_2$ is input to the gate electrode. A drain common connection node $N_1$ of the P channel field effect transistor $TR_{12}$ and the N channel field effect transistor $TR_{15}$ is one output end of the differential circuit 111, and one output signal $V_A$ of the differential circuit 111 is derived from the output end $N_1$.

The first-stage inverter circuit 112 includes a P channel field effect transistor $TR_{16}$ and an N channel field effect transistor $TR_{17}$ which are connected in series between the power supply $V_{dd1}$ on the high potential side and the power supply GND on the low potential side. The predetermined bias voltage $V_{Bias}$ is applied to a gate electrode of the P channel field effect transistor $TR_{16}$. A gate electrode of the N channel field effect transistor $TR_{17}$ is connected to the output end $N_1$ of the differential circuit 111. A drain common connection node $N_2$ of the P channel field effect transistor $TR_{16}$ and the N channel field effect transistor $TR_{17}$ is an output end of the inverter circuit 112, and a signal $V_c$ having a reversed phase from that of the one output signal $V_A$ of the differential circuit 111 is derived from the output end $N_2$.

The second-stage inverter circuit 113 includes a P channel field effect transistor $TR_{18}$ and an N channel field effect transistor $TR_{19}$ which are connected in series between the power supply $V_{dd1}$ on the high potential side and the power supply GND on the low potential side. Gate electrodes of the P channel field effect transistor $TR_{18}$ and the N channel field effect transistor $TR_{19}$ are commonly connected to the output end $N_2$ of the first-stage inverter circuit 112. A drain common connection node $N_3$ of the P channel field effect transistor $TR_{18}$ and the N channel field effect transistor $TR_{19}$ is an output end of the inverter circuit 113, and a signal $V_B$ having the same phase as that of the one output signal $V_A$ of the differential circuit 111 is derived from the output end $N_3$.

The cut-off unit 114 includes two switching elements respectively connected between the circuit input terminals $IN\_1$ and $IN\_2$ and a circuit output terminal OUT. The two switching elements are formed of N channel field effect transistors $TR_{21}$ and $TR_{22}$. The N channel field effect transistor $TR_{21}$ is connected between the circuit input terminal $IN\_1$ and the circuit output terminal OUT, and a gate electrode is connected to the output end $N_3$ of the second-stage inverter circuit 113. The N channel field effect transistor $TR_{22}$ is connected between the circuit input terminal $IN\_2$ and the circuit output terminal OUT, and a gate electrode is connected to the output end $N_2$ of the first-stage inverter circuit 112.

Figure 3:
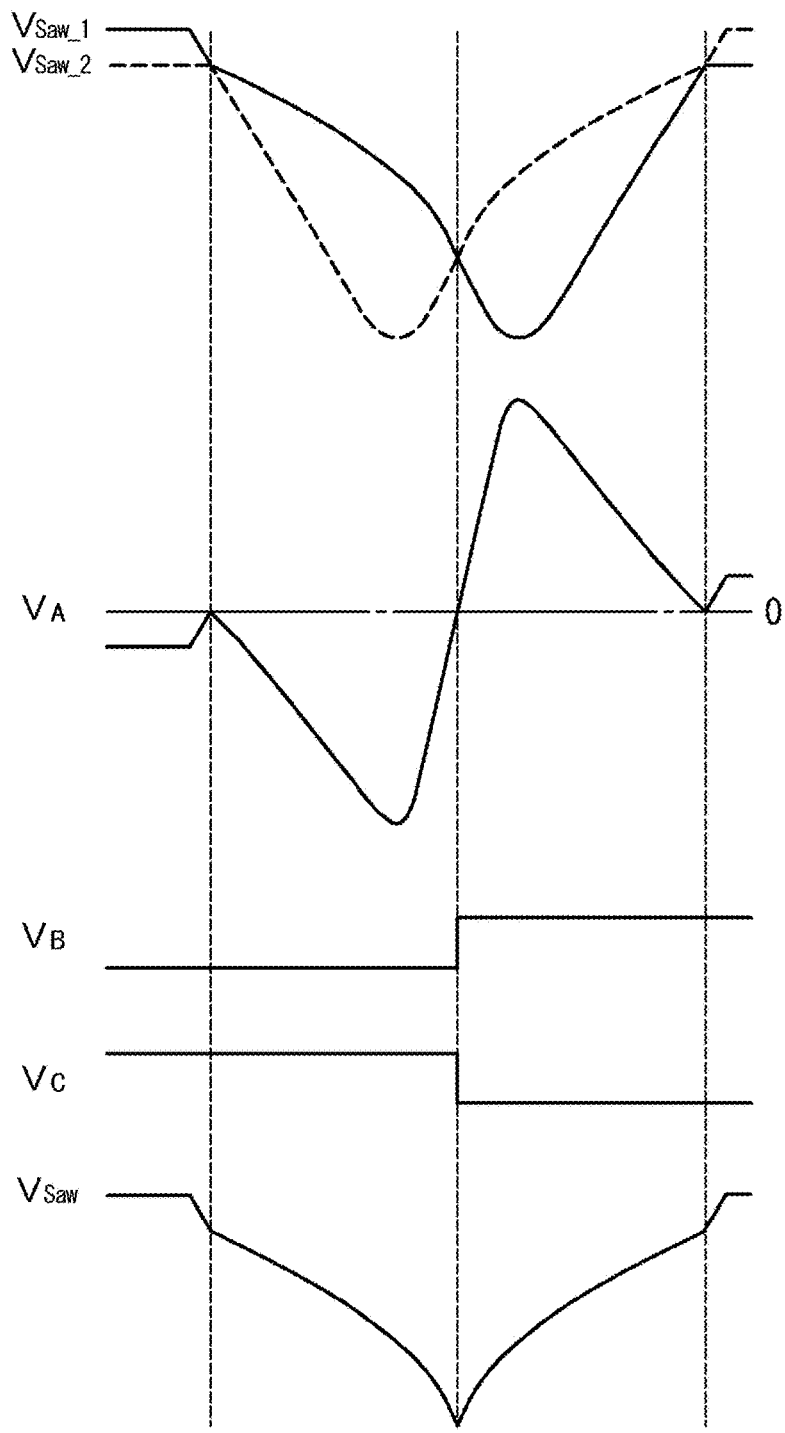
FIG. 3 is a waveform diagram to describe a circuit operation of the sawtooth waveform generating unit.

Next, a circuit operation of the sawtooth waveform generating unit 11 having the above-mentioned circuit structure is described with reference to the waveform diagram in FIG. 3. In FIG. 3, signal waveforms of respective units of the sawtooth waveform generating unit 11 are illustrated. That is, waveforms of the two reference signals $V_{Saw\_1}$ and $V_{Saw\_2}$, the one output signal $V_A$ of the differential circuit 111, the output signal $V_C$ of the first-stage inverter circuit 112, and the output signal $V_B$ of the second-stage inverter circuit 113 are illustrated.

In the sawtooth waveform generating unit 11 having the circuit structure illustrated in FIG. 2, the differential circuit 111 performs the differential operation according to the two reference signals $V_{Saw\_1}$ and $V_{Saw\_2}$ having the sawtooth waveforms so that a difference between the reference signals $V_{Saw\_1}$ and $V_{Saw\_2}$ is derived from the one output end $N_1$ of the differential circuit 111 as the one output signal $V_A$. The output signal $V_A$ is derived as the rectangular wave output signal $V_C$ illustrated in FIG. 3 by passing through the first-stage inverter circuit 112 and is derived as the output signal $V_B$ which is the rectangular wave similarly to the output signal $V_C$ by passing through the second-stage inverter circuit 113.

The output signal $V_C$ of the first-stage inverter circuit 112, that is, the signal $V_C$ having the reversed phase from the one output signal $V_A$ of the differential circuit 111 is applied to the gate electrode of the N channel field effect transistor $TR_{22}$ of the cut-off unit 114 as a switching signal. Accordingly, the N channel field effect transistor $TR_{22}$ responses to the output signal $V_C$ of the first-stage inverter circuit 112 and is in the conductive state, that is, the N channel field effect transistor $TR_{22}$ is in the conductive state in the waveform part of the reference signal $V_{Saw\_2}$ overlapped with the reference signal $V_{Saw\_1}$. As a result, the N channel field effect transistor $TR_{22}$ cuts off the sharp waveform part of the reference signal $V_{Saw\_2}$ overlapped with the reference signal $V_{Saw\_1}$.

The output signal $V_B$ of the second-stage inverter circuit 113, that is, the signal $V_B$ having the same phase as that of the one output signal $V_A$ of the differential circuit 111 is applied to the gate electrode of the N channel field effect transistor $TR_{21}$ of the cut-off unit 114 as a switching signal. Accordingly, the N channel field effect transistor $TR_{21}$ responses to the output signal $V_B$ of the second-stage inverter circuit 113 and is in the conductive state, that is, the N channel field effect transistor $TR_{21}$ is in the conductive state in the waveform part of the reference signal $V_{Saw\_1}$ overlapped with the reference signal $V_{Saw\_2}$. As a result, the N channel field effect transistor $TR_{21}$ cuts off the sharp waveform part of the reference signal $V_{Saw\_1}$ overlapped with the reference signal $V_{Saw\_2}$.

The respective source electrodes of the N channel field effect transistors $TR_{21}$ and $TR_{22}$ are commonly connected to the circuit output terminal OUT so that the waveform part cut off by the field effect transistor $TR_{21}$ and the waveform part cut off by the field effect transistor $TR_{22}$ are synthesized with each other. That is, the cut-off unit 114 has a function for cutting off the sharp waveform part where the sawtooth waveform two reference signals $V_{Saw\_1}$ and $V_{Saw\_2}$ are overlapped with each other and has a function for synthesizing the two cut-off waveform parts. The result which is cut off and synthesized by the cut-off unit 114 is derived from the circuit output terminal OUT as the sawtooth waveform voltage $V_{Saw}$.

As described above, the sawtooth waveform generating unit 11 according to the present example has the circuit structure to generate the sawtooth waveform voltage $V_{Saw}$ by cutting off the sharp waveform parts where the sawtooth waveform reference signals $V_{Saw\_1}$ and $V_{Saw\_2}$ are overlapped with each other based on the output signal $V_A$ of the differential circuit 111 and synthesizing the cut-off sharp waveform parts. In other words, in the above circuit structure, the waveforms of the sawtooth waveform reference signals $V_{Saw\_1}$ and $V_{Saw\_2}$ to be the base to generate the sawtooth waveform voltage $V_{Saw}$ are cut off and are synthesized with each other. Therefore, since the sawtooth waveform voltage $V_{Saw}$ can be generated by using the waveforms of the sawtooth waveform reference signals $V_{Saw\_1}$ and $V_{Saw\_2}$, the waveform of the sawtooth waveform voltage $V_{Saw}$ can be easily determined according to the waveforms of the reference signals $V_{Saw\_1}$ and $V_{Saw\_2}$.

The circuit structure of the sawtooth waveform generating unit 11 described above is only exemplary and is not limited to the one described above. Also, the conductive types of the field effect transistors $TR_{11}$ to $TR_{19}$, $TR_{21}$, and $TR_{22}$ included in the sawtooth waveform generating unit 11 are not limited to those of the field effect transistors illustrated in FIG. 2.

(Exemplary Circuit Structures of Comparison Unit and Constant Current Source Unit)

Figure 4:
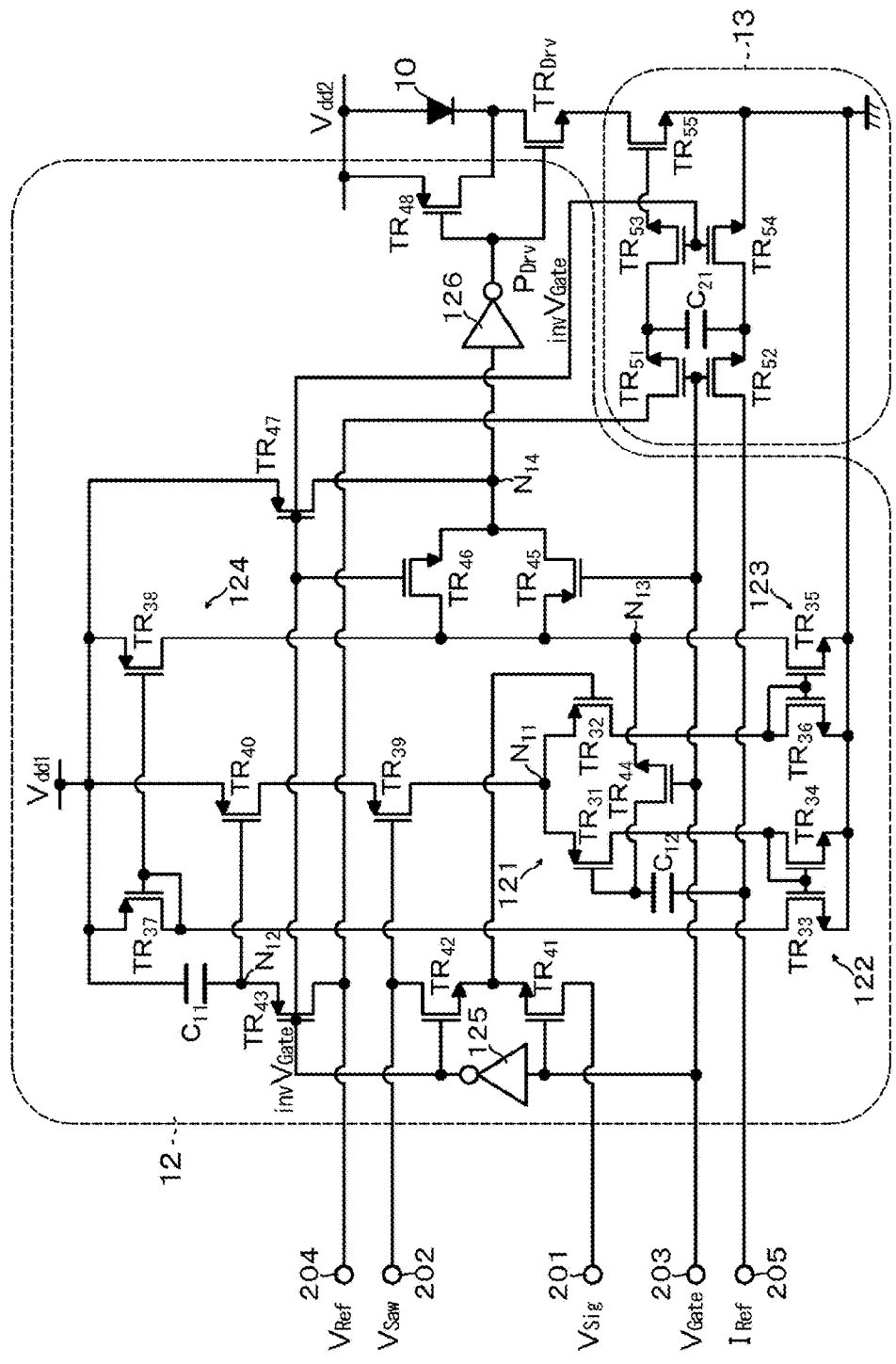
FIG. 4 is a circuit diagram of exemplary circuit structures of a comparison unit and a constant current source unit.

Next, specific circuit structures of the comparison unit 12 which compares the signal voltage $V_{Sig}$ of the video signal with the sawtooth waveform voltage $V_{Saw}$ and the constant current source unit 13 are described. FIG. 4 is a circuit diagram of exemplary circuit structures of the comparison unit 12 and the constant current source unit 13.

First, a circuit structure of the comparison unit 12 is described. The comparison unit 12 according to the present example has a structure of the differential comparator circuit having a differential circuit 121. The differential circuit 121 includes two P channel field effect transistors (differential pair transistors) $TR_{31}$ and $TR_{32}$ of which source electrodes are commonly connected and which operate a differential operation. A current mirror circuit 122 including N channel field effect transistors $TR_{33}$ and $TR_{34}$ is connected between a drain electrode of one field effect transistor $TR_{31}$ of the differential circuit 121 and the power supply GND on the low potential side. Also, a current mirror circuit 123 including N channel field effect transistors $TR_{35}$ and $TR_{36}$ is connected between a drain electrode of the other field effect transistor $TR_{32}$ of the differential circuit 121 and the power supply GND on the low potential side.

In the current mirror circuit 122, gate electrodes of the field effect transistors $TR_{33}$ and $TR_{34}$ are connected to each other. A drain electrode of the field effect transistor $TR_{33}$ is connected to the power supply $V_{dd1}$ on the high potential side via a P channel field effect transistor $TR_{37}$. The gate electrode and a drain electrode of the field effect transistor $TR_{34}$ are connected to each other. In the current mirror circuit 123, gate electrodes of the field effect transistors $TR_{35}$ and $TR_{36}$ are connected to each other. A drain electrode of the field effect transistor $TR_{35}$ is connected to the power supply $V_{dd1}$ on the high potential side via a P channel field effect transistor $TR_{38}$. The gate electrode and a drain electrode of the field effect transistor $TR_{36}$ are connected to each other. Gate electrodes of the two P channel field effect transistors $TR_{37}$ and $TR_{38}$ on the side of the power supply $V_{dd1}$ are connected to each other, and a gate electrode and a drain electrode of the field effect transistor $TR_{37}$ are connected to each other so as to form the current mirror circuit 124.

Two P channel field effect transistors $TR_{39}$ and $TR_{40}$ are connected in series between a source common connection node $N_{11}$ of the differential pair transistors $TR_{31}$ and $TR_{32}$ and the power supply $V_{dd1}$ on the high potential side. The field effect transistor $TR_{39}$ is an exemplary switch circuit and performs an on/off operation according to the sawtooth waveform voltage $V_{Saw}$ applied to the gate electrode via an input terminal 202. The field effect transistor $TR_{40}$ is a current source transistor for supplying the constant current to the differential circuit 121.

An N channel field effect transistor $TR_{41}$ is connected between the gate electrode of the differential pair transistor $TR_{32}$ to be one input end of the differential circuit 121 and the input terminal 201 to which the signal voltage $V_{Sig}$ of the video signal is input. The field effect transistor $TR_{41}$ is a signal writing transistor (sampling transistor) which takes in the signal voltage $V_{Sig}$ by responding to the high-level scanning signal $V_{Gate}$ which is input from the input terminal 203 and is directly applied to the gate electrode and being in the conductive state.

Also, an N channel field effect transistor $TR_{42}$ is connected between the gate electrode of the differential pair transistor $TR_{32}$ and the input terminal 202 to which the sawtooth waveform voltage $V_{Saw}$ is input. The field effect transistor $TR_{42}$ is a sawtooth wave writing transistor (sampling transistor) which takes in the sawtooth waveform voltage $V_{Saw}$ by responding to an inverted scanning signal $invV_{Gate}$ which is input from the input terminal 203, polarity-inverted by the inverter circuit 125, and applied to the gate electrode and being in the conductive state.

A P channel field effect transistor $TR_{43}$ and a capacitance element $C_{11}$ are connected in series between the input terminal 204 to which a reference voltage $V_{Ref}$ is input and the power supply $V_{dd1}$ on the high potential side. The field effect transistor $TR_{43}$ responses to the inverted scanning signal $invV_{Gate}$ which is input from the input terminal 203, polarity-inverted by the inverter circuit 125, and applied to the gate electrode and is in the conductive state. A voltage applied to a common connection node $N_{12}$ of the field effect transistor $TR_{43}$ and the capacitance element $C_{11}$ is applied to the gate electrode of the current source transistor $TR_{40}$ as a bias voltage. That is, the reference voltage $V_{Ref}$ input from the input terminal 204 is a voltage to determine the bias voltage to be applied to the gate electrode of the current source transistor $TR_{40}$.

A capacitance element $C_{12}$ is connected between an input terminal 205 to which a reference voltage $I_{Ref}$ is input and the gate electrode of the differential pair transistor $TR_{31}$ to be the other input end of the differential circuit 121. Also, an N channel field effect transistor $TR_{44}$ is connected between the gate electrode of the differential pair transistor $TR_{31}$ and a drain common connection node $N_{13}$ of the field effect transistors $TR_{35}$ and $TR_{38}$. The field effect transistor $TR_{44}$ responses to the high-level scanning signal $V_{Gate}$ applied to the gate electrode via the input terminal 203 and is in the conductive state so as to short-circuit between the gate electrode of the differential pair transistor $TR_{31}$ and the node $N_{13}$.

A P channel field effect transistor $TR_{45}$ and an N channel field effect transistor $TR_{46}$ are connected in parallel between the drain common connection node $N_{13}$ of the field effect transistors $TR_{35}$ and $TR_{38}$ and a node $N_{14}$. The field effect transistor $TR_{45}$ is in the conductive state when the level of the scanning signal $V_{Gate}$ which is input from the input terminal 203 and is directly applied to the gate electrode is low. Similarly, the field effect transistor $TR_{46}$ is in the conductive state when the level of the inverted scanning signal $invV_{Gate}$ which is input from the input terminal 203, polarity-inverted by the inverter circuit 125, and applied to the gate electrode is high.

A P channel field effect transistor $TR_{47}$ is connected between the node $N_{14}$ and the power supply $V_{dd1}$ on the high potential side. The field effect transistor $TR_{47}$ is in the conductive state when the level of the inverted scanning signal $invV_{Gate}$ which is input from the input terminal 203, polarity-inverted by the inverter circuit 125, and applied to the gate electrode is low. This makes the potential of the node $N_{14}$ be the potential of the power supply $V_{dd1}$. The potential of the node $N_{14}$ becomes a driving pulse $P_{Drv}$ by performing polarity inversion by the inverter circuit 126 and is applied to a gate electrode of the light emitting unit driving transistor $TR_{Drv}$. The light emitting unit 10 formed of the light emitting diode is connected to a P channel field effect transistor $TR_{48}$ in parallel.

Subsequently, the circuit structure of the constant current source unit 13 is described. The reference voltage $V_{Ref}$ is input from the input terminal 204 to the constant current source unit 13, and the reference voltage $I_{Ref}$ is input from the input terminal 205 to the constant current source unit 13. The constant current source unit 13 performs current/voltage conversion based on the reference voltage $V_{Ref}$ and the reference voltage $I_{Ref}$ and generates a constant current to be supplied to the light emitting unit 10. That is, the reference voltage $V_{Ref}$ and the reference voltage $I_{Ref}$ are voltages to determine the constant current to be supplied to the light emitting unit 10.

The constant current source unit 13 according to the present example includes N channel field effect transistors $TR_{51}$ to $TR_{55}$ and a capacitance element $C_{21}$. The field effect transistor $TR_{51}$ takes in the reference voltage $V_{Ref}$ by responding to the high-level scanning signal $V_{Gate}$ input from the input terminal 203 and being in the conductive state. The field effect transistor $TR_{52}$ takes in the reference voltage $I_{Ref}$ by responding to the high-level scanning signal $V_{Gate}$ input from the input terminal 203 and being in the conductive state. That is, when the level of the scanning signal $V_{Gate}$ is high, that is, when the signal voltage $V_{Sig}$ of the video signal is written, the reference voltage $V_{Ref}$ and the reference voltage $I_{Ref}$ are taken in the constant current source unit 13, and a differential voltage of them is written in the capacitance element $C_{21}$. In other cases, the reference voltages are not taken in the constant current source unit 13.

The field effect transistor $TR_{55}$ is a current source transistor for supplying the constant current to the light emitting unit driving transistor $TR_{Drv}$ and is connected to the light emitting unit driving transistor $TR_{Drv}$ in series. The capacitance element $C_{21}$ is connected between source electrodes of the field effect transistors $TR_{51}$ and $TR_{52}$.

The field effect transistor $TR_{53}$ is connected between the source electrode of the field effect transistor $TR_{51}$ and a gate electrode of the field effect transistor $TR_{55}$. The field effect transistor $TR_{53}$ is in the conductive state when the level of the inverted scanning signal $invV_{Gate}$ which is input from the input terminal 203, polarity-inverted by the inverter circuit 125, and applied to the gate electrode is high. The field effect transistor $TR_{54}$ is connected between the source electrode of the field effect transistor $TR_{52}$ and a source electrode of the field effect transistor $TR_{55}$. The field effect transistor $TR_{54}$ is in the conductive state when the level of the inverted scanning signal $invV_{Gate}$ which is input from the input terminal 203, polarity-inverted by the inverter circuit 125, and applied to the gate electrode is high. That is, the field effect transistor $TR_{53}$ and the field effect transistor $TR_{54}$ are in the conductive state in a case other than a case where the level of the scanning signal $invV_{Gate}$ is high, that is, a case where the signal voltage $V_{Sig}$ of the video signal is written so that voltages of the both ends of the capacitance element $C_{21}$ are applied between the gate and the source of the field effect transistor $TR_{55}$.

The circuit structures of the comparison unit 12 and the constant current source unit 13 described here are only exemplary, and the circuit structures are not limited to those described above. Also, the conductive types of the field effect transistors $TR_{31}$ to $TR_{48}$ included in the comparison unit 12 and the field effect transistors $TR_{51}$ to $TR_{55}$ included in the constant current source unit 13 are not limited to those illustrated in FIG. 4.

Second Embodiment

Figure 5:
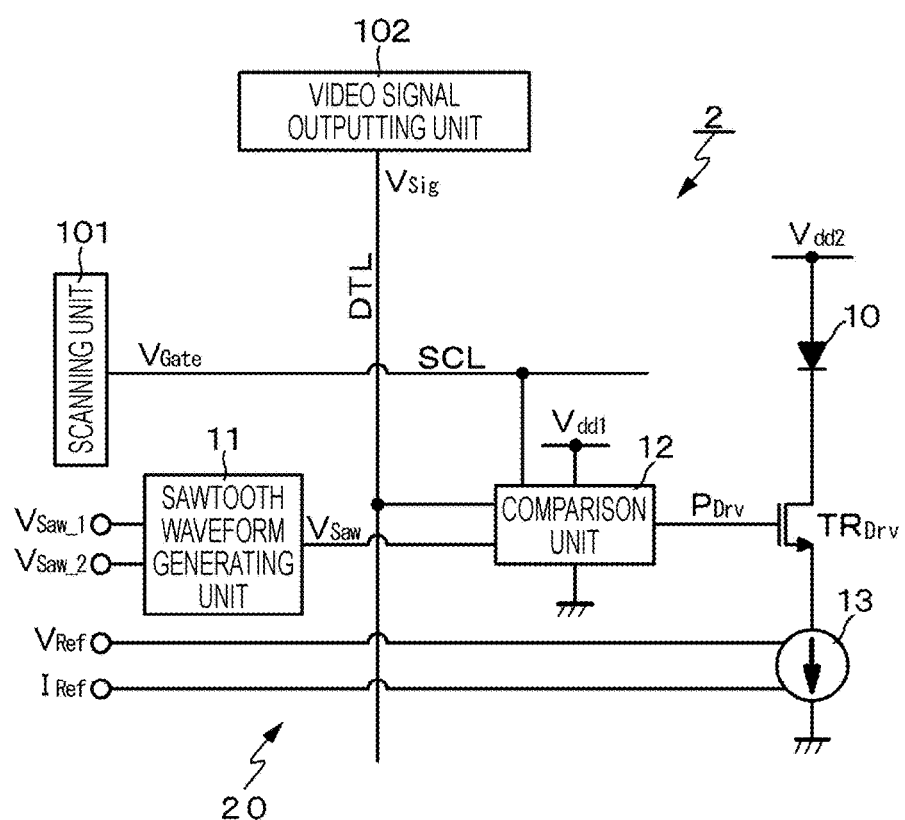
FIG. 5 is a schematic diagram of a pixel and the like configured by a light emitting unit and a drive circuit in a display according to a second embodiment.
Figure 6:
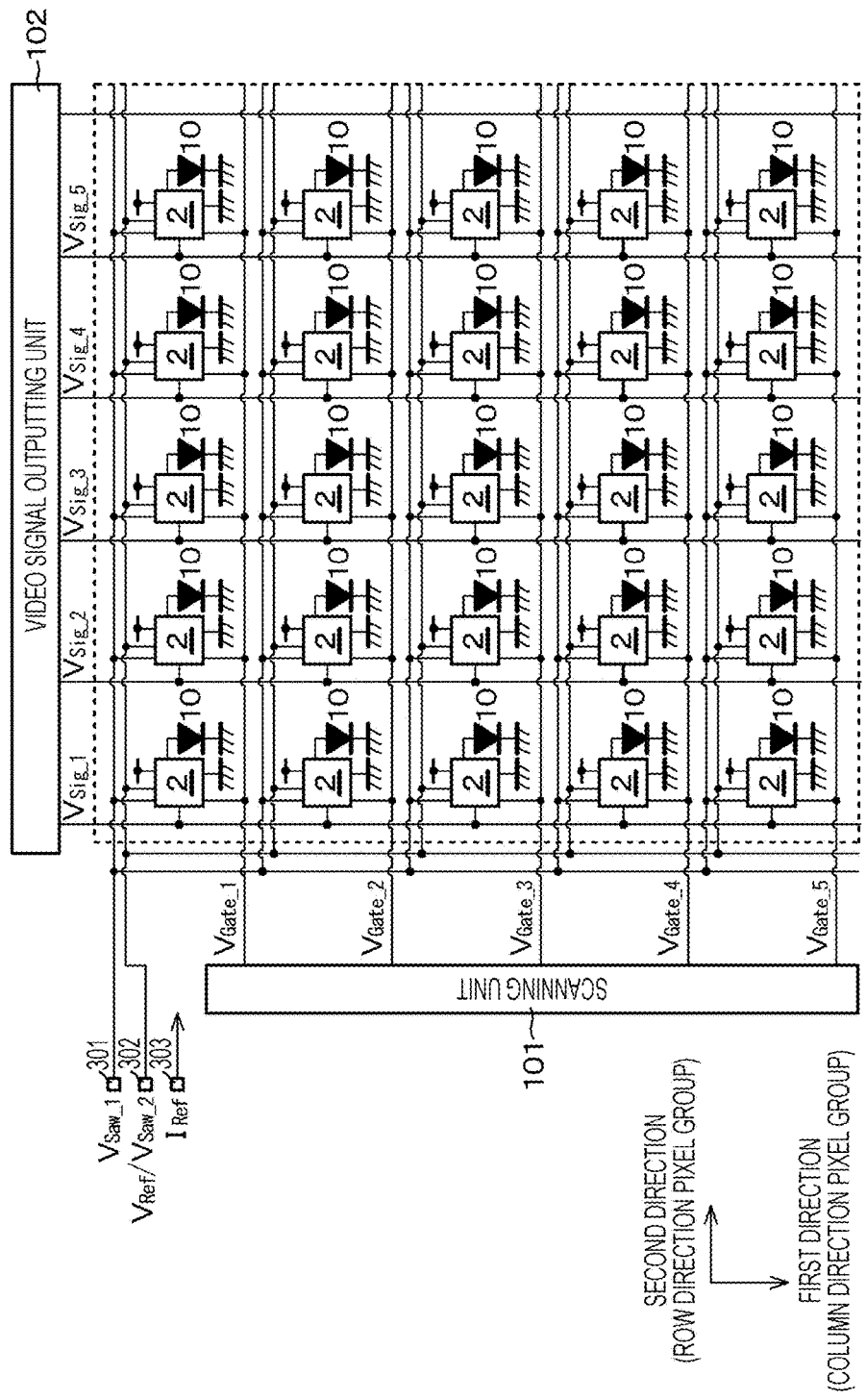
FIG. 6 is a schematic diagram of a circuit included in the display according to the second embodiment.

FIG. 5 is a schematic diagram of a pixel and the like including a light emitting unit and a drive circuit of a display (display according to the present disclosure) according to a second embodiment. FIG. 6 is a schematic diagram of a circuit for configuring the display according to the second embodiment. To simplify the drawings, a circuit structure of a single pixel is illustrated in FIG. 5 as a representative, and 5×5 pixels are illustrated in FIG. 6.

In the display according to the second embodiment, a plurality of pixels (more specifically, sub-pixel, and the same is applied to the following description) 2 including a light emitting unit 10 and a drive circuit 20 for driving the light emitting unit 10 is arranged in a two-dimensional matrix state. Specifically, the plurality of pixels 2 is arranged in a two-dimensional matrix state in a first direction and a second direction. The display according to the second embodiment further includes, for example, a scanning unit 101 and a video signal outputting unit 102 as a peripheral driving unit to drive the pixel 2.

The light emitting unit 10 is formed of a light emitting diode (LED). Each drive circuit 20 of the plurality of pixels 2 is formed of the light emitting device driving circuit 1 according to the first embodiment. According to this, the display according to the second embodiment uses a driving method for making the light emitting unit 10 emit the light for a period according to the potential based on a signal voltage $V_{Sig}$ of a video signal, that is, a driving method for performing PWM driving to the light emitting unit 10. According to the PWM driving method, unevenness of light emission of the light emitting unit 10 can be reduced.

More specifically, as illustrated in FIG. 5, each drive circuit 20 of the plurality of pixels 2 includes a sawtooth waveform generating unit 11, a comparison unit 12, a light emitting unit driving transistor $TR_{Drv}$, and a constant current source unit 13. The light emitting unit driving transistor $TR_{Drv}$ is formed of, for example, an N channel field effect transistor. However, the light emitting unit driving transistor $TR_{Drv}$ is not limited to the N channel field effect transistor. The light emitting unit driving transistor $TR_{Drv}$ is connected to the light emitting unit 10 to be driven in series together with the constant current source unit 13 and connected between a power supply $V_{dd}$ ($V_{dd2}$) on the high potential side and a power supply on the low potential side (for example, ground GND).

The sawtooth waveform generating unit 11 generates a sawtooth waveform voltage $V_{Saw}$ having a sawtooth waveform voltage change based on two reference signals $V_{Saw\_1}$ and $V_{Saw\_2}$ to be input and applies it to the comparison unit 12. The sawtooth waveform voltage $V_{Saw}$ is applied to the comparison unit 12. Also, the signal voltage (light emitting intensity signal) $V_{Sig}$ is applied to the comparison unit 12. Specifically, the signal voltage $V_{Sig}$ is a video signal voltage for controlling a light emitting state (luminance) of the pixel 2.

The comparison unit 12 is formed of a comparator circuit and has the signal voltage $V_{Sig}$ of the analog video signal supplied via a data line DTL as a comparison input by synchronizing it with the scanning signal $V_{Gate}$ applied via a scanning line SCL and taking in it. The comparison unit 12 compares the signal voltage $V_{Sig}$ of the video signal which is the comparison input with the sawtooth waveform voltage $V_{Saw}$ which is applied from the sawtooth waveform generating unit 11 as the comparison reference input. The comparison unit 12 outputs a driving pulse $P_{Drv}$ having a pulse width according to the magnitude of the signal voltage $V_{Sig}$ as the comparison result.

The constant current source unit 13 supplies a constant current to the light emitting unit driving transistor $TR_{Drv}$. The light emitting unit driving transistor $TR_{Drv}$ supplies a current to the light emitting unit 10 and makes the light emitting unit 10 emit light by being driven by a driving pulse $P_{Drv}$ output from the comparison unit 12.

Figure 7:
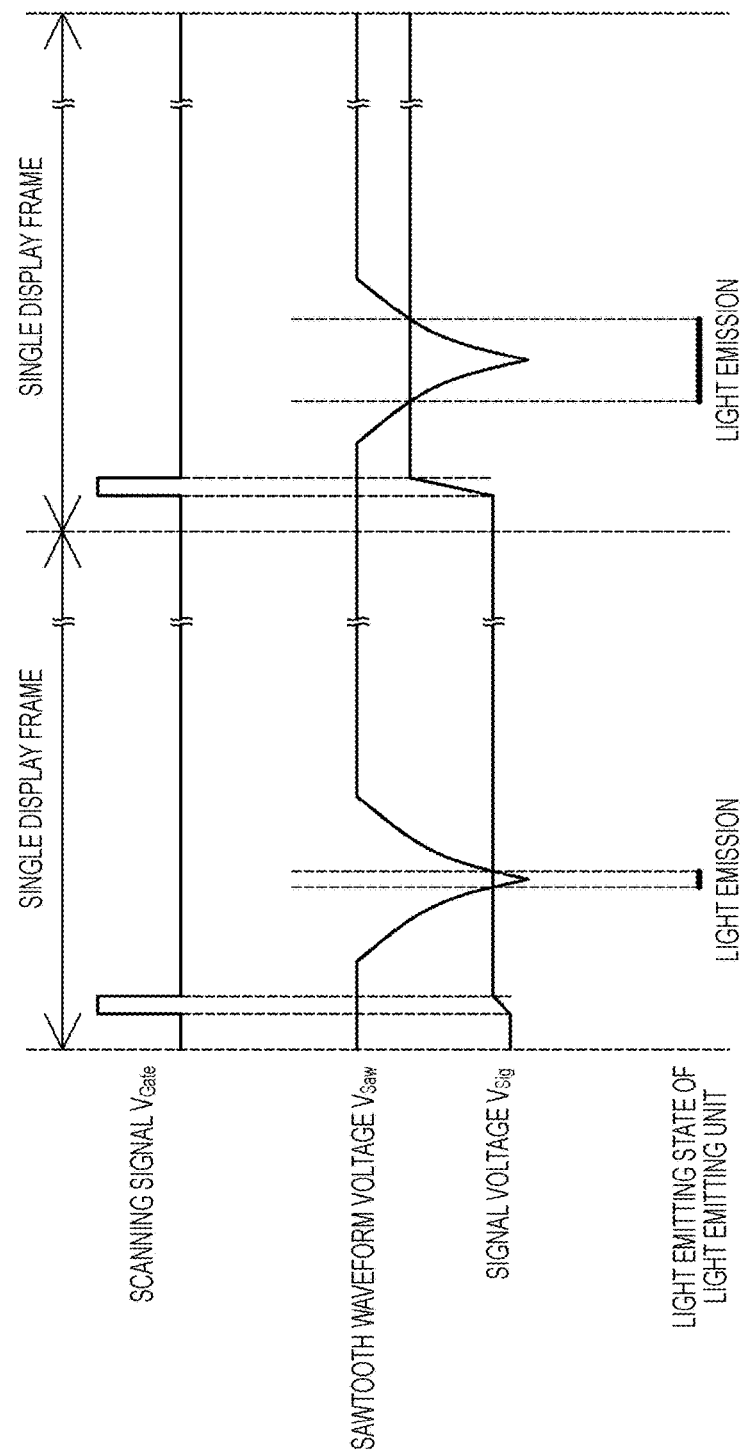
FIG. 7 is a schematic diagram to describe an operation of a single pixel in the display according to the second embodiment.

FIG. 7 is a schematic diagram to describe an operation of the single pixel in the display according to the second embodiment. In FIG. 7, waveforms of the scanning signal $V_{Gate}$ the sawtooth waveform voltage $V_{Saw}$, and the signal voltage $V_{Sig}$ and the light emitting state of the light emitting unit 10 are illustrated. Regarding the sawtooth waveform voltage $V_{Saw}$, a low gradation part (low voltage part) is sharply changed, and especially, the sawtooth waveform voltage $V_{Saw}$ is sensitive relative to the waveform quality of the low gradation part.

For example, the light emitting period of the light emitting unit 10 is based on the signal voltage $V_{Sig}$ applied from the video signal outputting unit 102 and the sawtooth waveform voltage $V_{Saw}$ applied from the sawtooth waveform generating unit 11. Gamma correction is performed by using the sawtooth waveform voltage $V_{Saw}$ which changes as the time elapses. That is, an absolute value of a rate of change of the sawtooth waveform voltage $V_{Saw}$ having the time as a variable is proportional to a constant 2.2. Therefore, it is not necessary to provide a circuit for the gamma correction.

In the display according to the second embodiment, by using the light emitting device driving circuit 1 according to the first embodiment as each drive circuit 20 of the plurality of pixels 2, each pixel 2 (each drive circuit 20) includes the sawtooth waveform generating unit 11 which generates the sawtooth waveform voltage $V_{Saw}$ based on the two reference signals $V_{Saw\_1}$ and $V_{Saw\_2}$ to be input.

Figure 8:
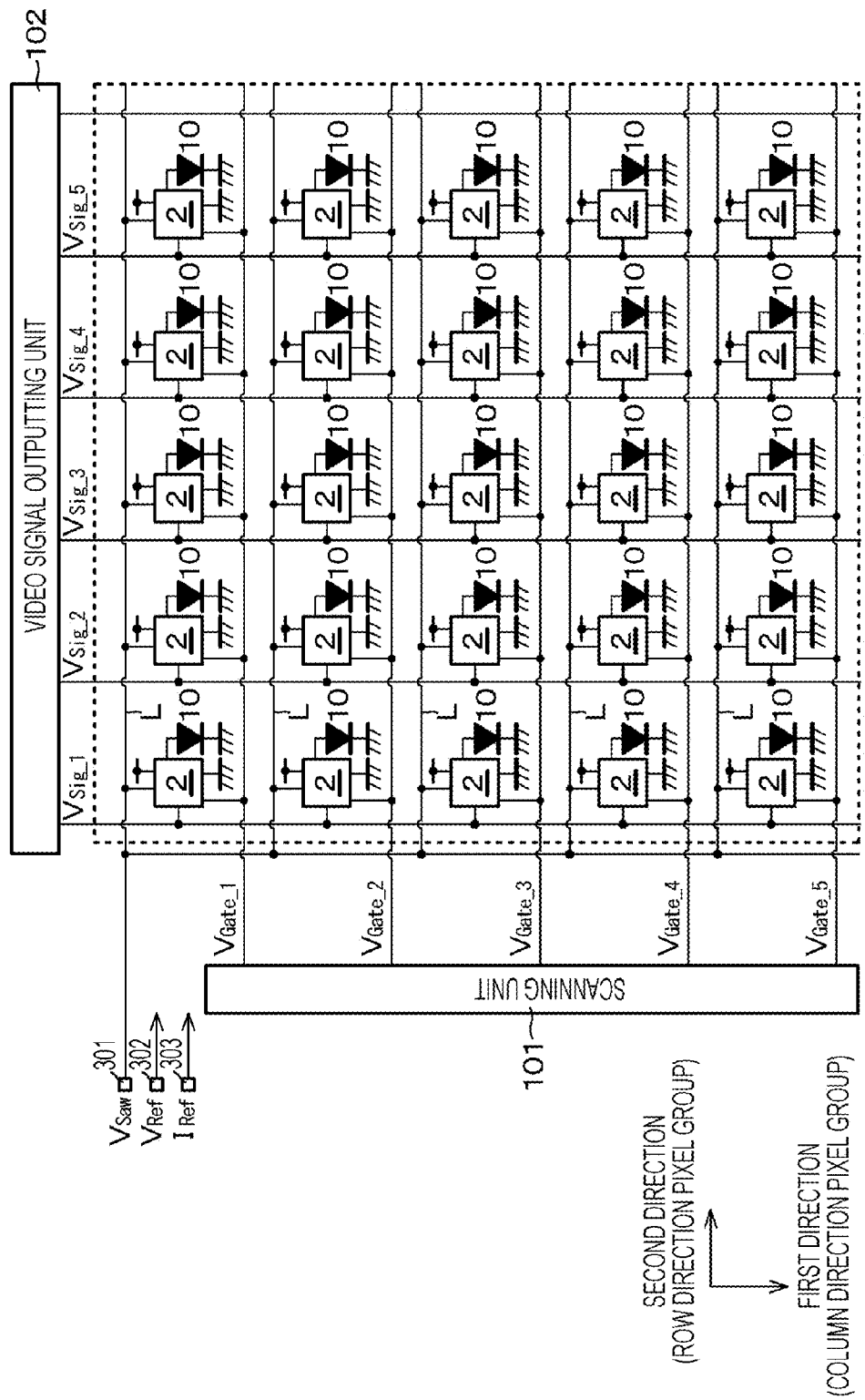
FIG. 8 is a schematic diagram of a circuit included in a display according to a reference example.

Generally, the display which employs the PWM driving method has a structure in which the sawtooth waveform voltage $V_{Saw}$ is input to each drive circuit 20 of the plurality of pixels 2 from outside. The structure of the display for employing the structure in which the sawtooth waveform voltage $V_{Saw}$ is input from outside is illustrated in FIG. 8 as a reference example. As illustrated in FIG. 8, the display according to the reference example includes a first input terminal 301 for inputting the sawtooth waveform voltage $V_{Saw}$. The sawtooth waveform voltage $V_{Saw}$ is input from the first input terminal 301 and is transmitted to each pixel 2 for each pixel row by using transmission wiring L provided for each pixel row. The sawtooth waveform voltage $V_{Saw}$ is input from the input terminal 202 in FIG. 4 to the comparison unit 12.

The display according to the reference example includes a second input terminal 302 for inputting the reference voltage $V_{Ref}$ and a third input terminal 303 for inputting the reference voltage $I_{Ref}$ in addition to the first input terminal 301. After the second input terminal 302 has input the reference voltage $V_{Ref}$, the reference voltage $V_{Ref}$ is input to the comparison unit 12 and the constant current source unit 13 via the input terminal 204 in FIG. 4. After the third input terminal 303 has input the reference voltage $I_{Ref}$, the reference voltage $I_{Ref}$ is input to the comparison unit 12 and the constant current source unit 13 via the input terminal 205 in FIG. 4.

When the display has the structure in which the sawtooth waveform voltage $V_{Saw}$ is input to each drive circuit 20 of the plurality of pixels 2 from outside as the display according to the reference example, there is a case where the distortion of the waveform of the sawtooth waveform voltage $V_{Saw}$ is generated by the influence of an impedance of the wiring L for transmitting the sawtooth waveform voltage $V_{Saw}$. Regarding this case, the description is made with reference to a schematic diagram in FIG. 9.

Figure 9:
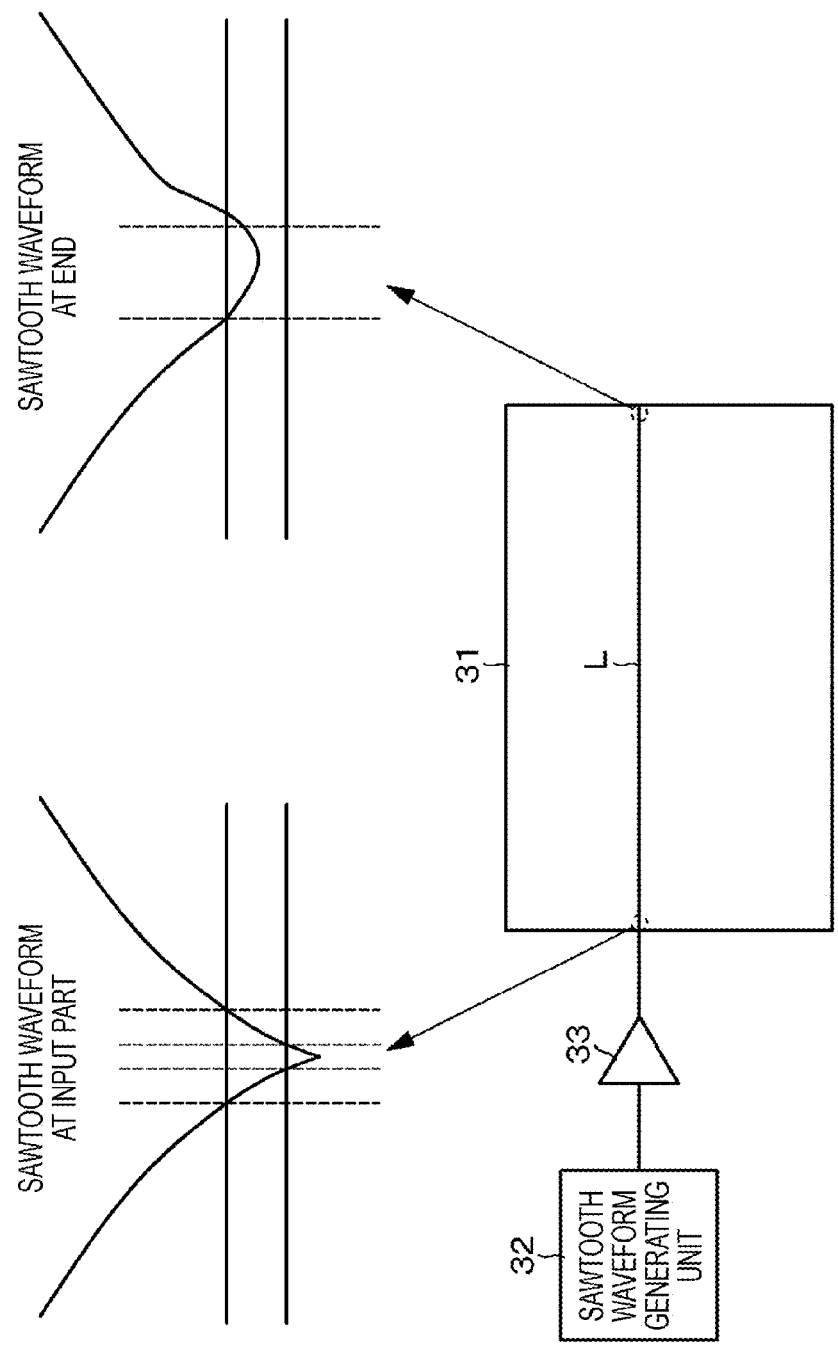

As illustrated in FIG. 9, the sawtooth waveform voltage $V_{Saw}$ generated by a sawtooth waveform generating unit 32 provided outside is input from a terminal provided in a display panel 31 (corresponding to second input terminal 302 in FIG. 8) to the display panel 31 via an output buffer 33. The display panel 31 is formed by forming the plurality of pixels 2 and the like on a substrate. The sawtooth waveform voltage $V_{Saw}$ is transmitted to each pixel 2 for each pixel row by using the transmission wiring L provided for each pixel row.

In a case where the impedance of the wiring L is large in the transmission of the sawtooth waveform voltage $V_{Saw}$ by using the transmission wiring L, as illustrated in FIG. 9, even when sharpness of the front end part of the sawtooth waveform voltage $V_{Saw}$ is high at an input part of the wiring L, the distortion of the waveform of the front end part of the sawtooth waveform voltage $V_{Saw}$ is generated at an end of the wiring L. In the display which employs the PWM driving method, especially, when the waveform of the front end part of the sawtooth waveform voltage $V_{Saw}$, that is, the waveform of a part where the sharpness is required for the low-gradation display is disturbed, the luminance and the chromaticity are not accurately displayed relative to the same video signal voltages $V_{Sig}$, and display unevenness is generated. In extreme cases, a problem occurs such that a part of a screen does not emit light with a low gradation.

Here, the following case can be exemplified as a case where the impedance of the transmission wiring L is increased. As an example, a case is considered where a glass substrate is used as the substrate of the display panel 31. When the glass substrate is used as the substrate of the display panel 31, the transmission wiring L is formed on the glass substrate. As a glass substrate (glass wiring substrate) which can be inexpensively obtained in general, an Al sputtering wiring substrate used for a thin film transistor (TFT) can be considered. However, in a case of the Al sputtering wiring substrate, the film thickness of the wiring cannot be made to be thick and is about one micron. Therefore, the impedance of the wiring gets higher than that in a case where a glass epoxy substrate or the like is used.

Also, higher definition of the display is required, and accordingly, the size of the pixel is required to be smaller. In addition, the line width of the transmission wiring L of the sawtooth waveform voltage $V_{Saw}$ provided between the pixels is reduced. When the line width of the wiring is reduced, the impedance of the transmission wiring L gets higher correspondingly. Also, when the wiring length of the transmission wiring L gets longer in accordance with the increase in size of the display and the number of pixels is increased in accordance with higher definition, the wiring width of the transmission wiring L gets narrower according to that, and the impedance of the transmission wiring L gets higher according to that. According to the above reasons, when the impedance of the transmission wiring L of the sawtooth waveform voltage $V_{Saw}$ gets higher, the waveform of the sawtooth waveform voltage $V_{Saw}$ is disturbed as a transmission distance gets longer.

The display according to the second embodiment is made to solve the problem in that the waveform of the sawtooth waveform voltage $V_{Saw}$ is disturbed by the influence of the impedance of the transmission wiring L of the sawtooth waveform voltage $V_{Saw}$. The display according to the second embodiment has a structure in which the sawtooth waveform generating unit 11 for generating the sawtooth waveform voltage $V_{Saw}$ is provided in each of the plurality of pixels 2 (each drive circuit 20). Accordingly, the display according to the second embodiment does not need to transmit the sawtooth waveform voltage $V_{Saw}$ by using the transmission wiring L as the display according to the reference example. Therefore, the problem can be solved such that the waveform of the sawtooth waveform voltage $V_{Saw}$ is disturbed by the influence of the impedance of the transmission wiring L and the like.

As a result, even when the glass substrate is used as the substrate of the display panel 31, the distortion of the waveform of the sawtooth waveform voltage $V_{Saw}$ can be prevented. The display which employs the PWM driving method can drive the light emitting unit 10 by the driving pulse $P_{Drv}$ having the pulse width accurately corresponding to the magnitude of the signal voltage $V_{Sig}$ of the video signal. Therefore, since the luminance and the chromaticity accurately corresponding to the magnitude of the signal voltage $V_{Sig}$ can be displayed, the generation of the display unevenness can be prevented.

On the other hand, the two reference signals $V_{Saw\_1}$ and $V_{Saw\_2}$ are transmitted to each pixel 2 for each pixel row by using the wiring provided for each pixel row. However, the distortion of the waveform can be smaller than that in a case where the sawtooth waveform voltage $V_{Saw}$ is transmitted. As described above, this is because a sawtooth waveform signal of which the voltage is more gently changed than the sawtooth waveform voltage $V_{Saw}$, that is, a signal closer to sine waves than the sawtooth waveform voltage $V_{Saw}$ is used as the reference signals $V_{Saw\_1}$ and $V_{Saw\_2}$.

More specifically, a signal line provided for each pixel row has not only a resistance component R of the wiring but also a capacitance component C. The resistance component R and the capacitance component C form an RC low pass filter. That is, the signal line including the resistance component R and the capacitance component C has frequency characteristics. When a signal, of which the voltage is rapidly changed, such as the sawtooth waveform voltage $V_{Saw}$ passes through the RC low pass filter, a high frequency component is eliminated. As a result, the voltage is gently changed, and the waveform is disturbed (deformed).

As described above, by using the sawtooth waveform signal of which the voltage is more gently changed than the sawtooth waveform voltage $V_{Saw}$ as the two reference signals $V_{Saw\_1}$ and $V_{Saw\_2}$, the distortion of the waveform can be reduced more than that a case where the sawtooth waveform voltage $V_{Saw}$ is transmitted. Frequencies of the two reference signals $V_{Saw\_1}$ and $V_{Saw\_2}$ may be determined based on the frequency characteristics of the signal line (transmission wiring) for transmitting the reference signals $V_{Saw\_1}$ and $V_{Saw\_2}$.

When a structure is employed in which the sawtooth waveform generating unit 11 is provided in each of the plurality of pixels 2 (each drive circuit 20) and the sawtooth waveform voltage $V_{Saw}$ is generated based on the two reference signals $V_{Saw\_1}$ and $V_{Saw\_2}$, it is necessary to provide two terminals to input the reference signals $V_{Saw\_1}$ and $V_{Saw\_2}$. The display according to the reference example for employing the structure in which the sawtooth waveform voltage $V_{Saw}$ is input from outside to each drive circuit 20 of the plurality of pixels 2 needs a single terminal (first input terminal 301) to input the sawtooth waveform voltage $V_{Saw}$ as illustrated in FIG. 8.

Whereas, the display according to the second embodiment has a structure in which an existing terminal is also used as the terminal to input the reference signals $V_{Saw\_1}$ and $V_{Saw\_2}$. Specifically, in the display according to the reference example, the second input terminal 302 for inputting a predetermined voltage which is not used when the light emitting unit 10 emits light such as the reference voltage $V_{Ref}$ is also used as the terminal to input the reference signals $V_{Saw\_1}$ and $V_{Saw\_2}$.

Here, the reason why the second input terminal 302 which inputs the predetermined voltage such as the reference voltage $V_{Ref}$ can be also used as the terminal to input the reference signals $V_{Saw\_1}$ and $V_{Saw\_2}$ is described. As described above, the reference voltage $V_{Ref}$ is a voltage used to determine the constant current to be supplied to the light emitting unit 10 in the constant current source unit 13. The reference voltage $V_{Ref}$ is not taken in the constant current source unit 13 other than the case where the signal voltage $V_{Sig}$ of the video signal is written. That is, the reference voltage $V_{Ref}$ is the voltage which is not used when the light emitting unit 10 emits light.

On the other hand, the sawtooth waveform voltage $V_{Saw}$ is required in the light emitting period of the light emitting unit 10. Therefore, it is preferable that the reference signals $V_{Saw}$ and $V_{Saw\_2}$ be input to the sawtooth waveform generating unit 11 in the light emitting period. Since the period when the signal voltage $V_{Sig}$ is written is not overlapped with the light emitting period of the light emitting unit 10, the second input terminal 302 for inputting the reference voltage $V_{Ref}$ can be also used as the terminal to input the reference signals $V_{Saw\_1}$ and $V_{Saw\_2}$.

Specifically, as illustrated in FIG. 6, in the display according to the second embodiment, the first input terminal 301 used to input the sawtooth waveform voltage $V_{Saw}$ in the display according to the reference example is used as the input terminal of the reference signal $V_{Saw\_1}$. The first input terminal 301 inputs the reference signal $V_{Saw\_1}$ when the sawtooth waveform voltage $V_{Saw}$ is generated. Also, the second input terminal 302 used to input the reference voltage $V_{Ref}$ in the display according to the reference example is used as the input terminal of the reference voltage $V_{Ref}$ and the reference signal $V_{Saw\_2}$. The second input terminal 302 inputs the predetermined voltage (for example, reference voltage $V_{Ref}$) when at least the signal voltage $V_{Sig}$ is written and inputs the reference signal $V_{Saw\_2}$ when the sawtooth waveform voltage $V_{Saw}$ is generated.

Here, the reference voltage $V_{Ref}$ used to determine the constant current to be supplied to the light emitting unit 10 is exemplified as the predetermined voltage. However, the predetermined voltage is not limited to the reference voltage $V_{Ref}$. When the voltage is not used when the light emitting unit 10 emits light, the terminal for inputting the above voltage can be also used as the terminal to input the reference signals $V_{Saw\_1}$ and $V_{Saw\_2}$.

Figure 10:
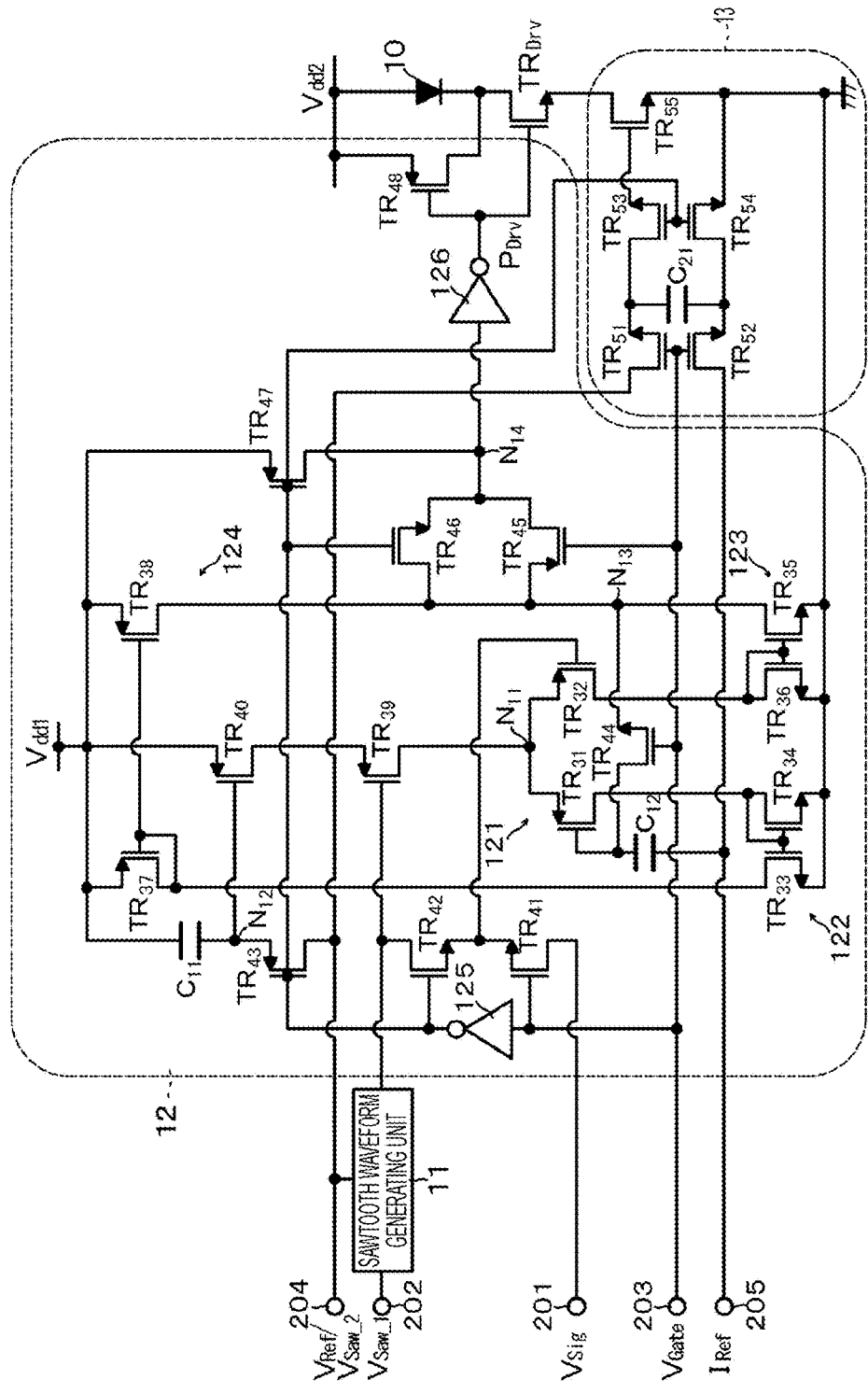
FIG. 10 is a circuit diagram of a structure of the drive circuit in the display according to the second embodiment.

As described above, when the sawtooth waveform generating unit 11 is included and the sawtooth waveform voltage $V_{Saw}$ is generated based on the two reference signals $V_{Saw\_1}$ and $V_{Saw\_2}$, the structure in which the existing terminal is used in two ways is employed. Accordingly, there is an advantage such that it is not necessary to increase the number of terminals of the display panel 31. Also, as illustrated in FIG. 10, in each of the plurality of pixels 2 (drive circuit 20), since the input terminal 204 can be commonly used as the input terminal of the reference voltage $V_{Ref}$ and the reference signal $V_{Saw\_2}$, there is an advantage such that it is not necessary to increase the number of terminals of the drive circuit 20.

Third Embodiment

Next, regarding the principle of the light emitting device driving circuit 1 according to the first embodiment, a third embodiment is described which is applied to an A/D conversion circuit for converting an analog signal into a digital signal by using a sawtooth waveform voltage $V_{Saw}$. In the third embodiment, a case is described where the technique of the light emitting device driving circuit 1 according to the first embodiment is applied to an A/D conversion circuit in a column parallel A/D conversion system solid-state imaging device as an example.

Figure 11:
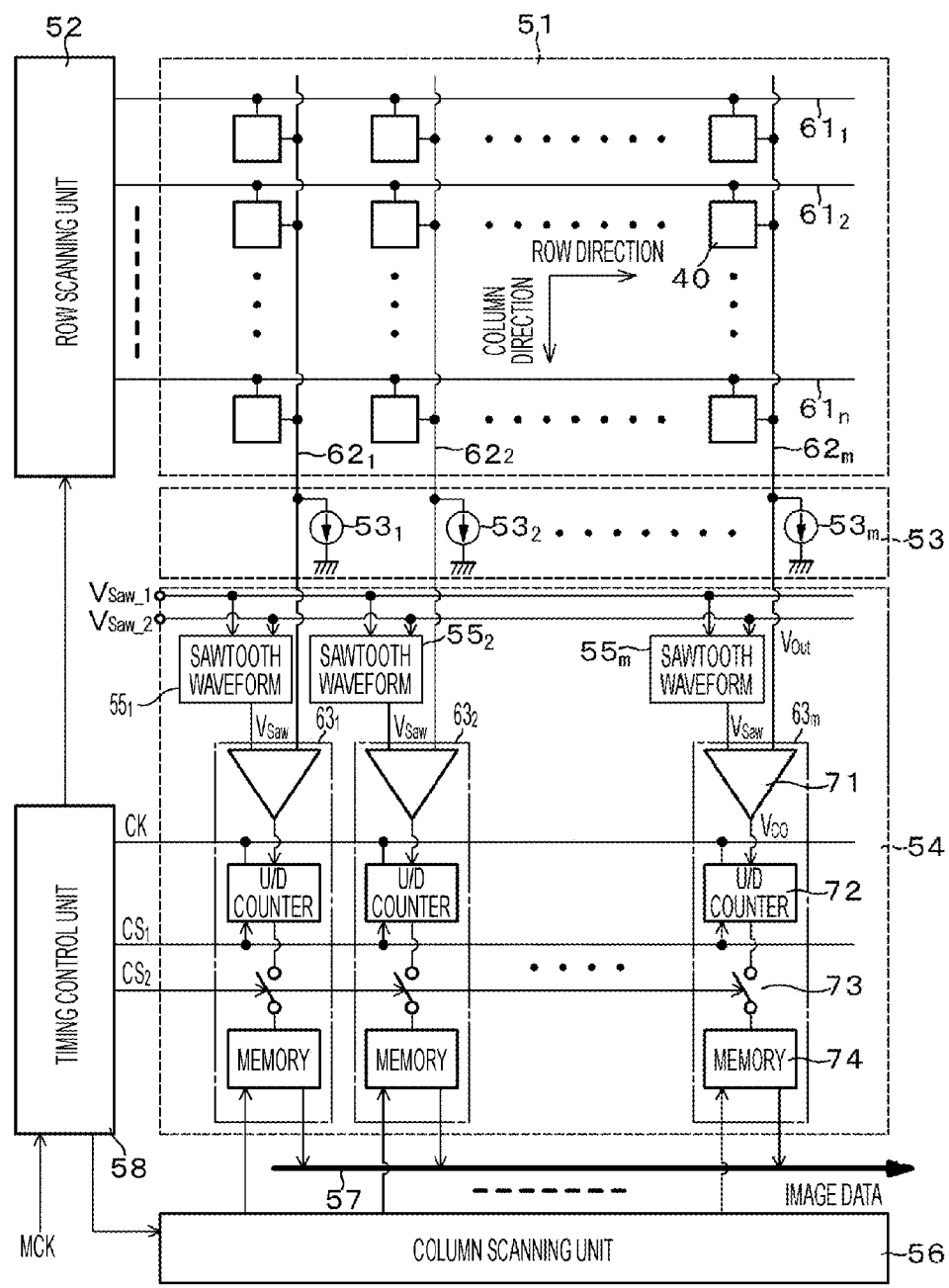
FIG. 11 is a system structure diagram of an outline structure of a solid-state imaging device using a column parallel A/D conversion system according to a third embodiment.

FIG. 11 is a system structure diagram of an outline structure of a CMOS image sensor which is a type of the solid-state imaging device according to the third embodiment such as an X-Y address system solid-state imaging device. Here, the CMOS image sensor is an image sensor created by applying or partially using a CMOS process.

[System Structure]

As illustrated in FIG. 11, the CMOS image sensor according to the third embodiment includes a pixel array unit 51, a peripheral drive system for driving each pixel 40 of the pixel array unit 51, and a signal processing system. The pixel array unit 51 is formed by arranging the pixels 40 in a two-dimensional matrix state. In the present example, for example, a row scanning unit 52, a current source 53, a column processing unit 54, a sawtooth waveform generating unit 55, a column scanning unit 56, a horizontal output line 57, and a timing control unit 58 are provided as the peripheral drive system and the signal processing system. The drive system and the signal processing system are integrated on a semiconductor substrate (chip) where the pixel array unit 51 is integrated.

In this system structure, the timing control unit 58 generates a clock signal CK and control signals $CS_1$ and $CS_2$ to be a reference of operations of the row scanning unit 52, the column processing unit 54, and the column scanning unit 56 based on a master clock MCK. The clock signal CK and the control signals $CS_1$ and $CS_2$ generated by the timing control unit 58 are applied to the row scanning unit 52, the column processing unit 54, the column scanning unit 56, and the like as driving signals for them.

The pixel array unit 51 has a structure in which the pixels 40 which have photoelectric converters for generating a photoelectric charge according to an amount of received light and accumulating it are arranged in the row direction and the column direction, that is, are arranged in a two-dimensional matrix state. Here, the row direction indicates an arrangement direction of the pixels of the pixel row (that is, horizontal direction), and the column direction indicates an arrangement direction of the pixels of the pixel column (that is, vertical direction).

In the pixel array unit 51, in the pixel arrangement in a matrix form, a row control line 61 ($61_1$ to $61_n$) is arranged for each pixel row along the row direction, and a column signal line 62 ($62_1$ to $62_m$) is arranged for each pixel column along the column direction. The row control line 61 transmits a control signal to perform control when the signal is read from the pixel 40. The row control line 61 is illustrated as a single wiring in FIG. 11. However, the number of row control lines 61 is not limited to one. The respective ends of the row control lines $61_1$ to $61_n$ are connected to the respective output ends of the row scanning unit 52 for corresponding to each row. The current sources $53_1$ to $53_m$ are respectively connected to the column signal lines $62_1$ to $62_m$.

The row scanning unit 52 includes a shift register and an address decoder and drives the pixels 40 of the pixel array unit 51 at the same time or line by line. That is, the row scanning unit 52 and the timing control unit 58 for controlling the row scanning unit 52 form a driving unit for driving each pixel 40 of the pixel array unit 51. A specific structure of the row scanning unit 52 is not illustrated. However, the row scanning unit 52 generally includes two scanning systems, i.e., a read scanning system and a sweeping scanning system.

The read scanning system selects and scans the pixels 40 of the pixel array unit 51 row by row in order to read a signal from the pixel 40. The signal read from the pixel 40 is the analog signal. The sweeping scanning system sweeps and scans the pixels a period of time of a shutter speed earlier than the read scanning relative to a read row to which the read scanning is performed by the read scanning system. By performing the sweep scanning by the sweeping scanning system, unnecessary electric charges are swept out from the photoelectric converter of the pixel 40 in the read row. Accordingly, the photoelectric converter is reset. By sweeping out (reset) the unnecessary electric charges by the sweeping scanning system, a so-called electronic shutter operation is performed. Here, the electronic shutter operation is an operation for throwing out the photoelectric charge of the photoelectric converter and for newly starting exposure (start to accumulate photoelectric charges).

A signal read by the read operation by the read scanning system corresponds to an amount of light received after the read operation performed immediately before that or after the electronic shutter operation. A period from a read timing by the read operation performed immediately before or a sweep-out timing by the electronic shutter operation to the read timing of the read operation at this time is an exposure time of the photoelectric charge in the pixel 40.

The column processing unit 54 includes A/D conversion circuits 63 ($63_1$ to $63_m$), for example, provided for each pixel column of the pixel array unit 51, that is, for each column signal line 62 ($62_1$ to $62_m$) in a one-to-one correspondence relation. The A/D conversion circuits 63 ($63_1$ to $63_m$) convert the analog signal (pixel signal) output from each pixel 40 of the pixel array unit 51 for each column via the column signal lines $62_1$ to $62_m$ into the digital signal.

The sawtooth waveform generating units 55 ($55_1$ to $55_m$) are provided for each pixel column of the pixel array unit 51 as respectively corresponding to the A/D conversion circuits 63 ($63_1$ to $63_m$). The sawtooth waveform generating units 55 ($55_1$ to $55_m$) generate the ramp waveform sawtooth waveform voltage $V_{Saw}$ having the sawtooth waveform voltage change based on the two reference signals $V_{Saw\_1}$ and $V_{Saw\_2}$ to be input. The sawtooth waveform generating units 55 ($55_1$ to $55_m$) supply the generated sawtooth waveform voltage $V_{Saw}$ to the A/D conversion circuits $63_1$ to $63_m$.

All the A/D conversion circuits $63_1$ to $63_m$ have the same structures. Here, a specific structure of the A/D conversion circuit $63_m$ in the m-th column is described as an example. The A/D conversion circuit $63_m$ includes a comparator circuit 71, an up/down counter (indicated as "U/D counter" in FIG. 11) 72 which is a counting unit, a transfer switch 73, and a memory device 74.

The comparator circuit 71 compares a signal voltage $V_{Out}$ of the column signal line $62_m$ according to the pixel signal output from each pixel 40 of the pixel array unit 51 in the m-th column with the sawtooth waveform voltage $V_{Saw}$ generated by the sawtooth waveform generating unit $55_m$. For example, when the sawtooth waveform voltage $V_{Saw}$ is higher than the signal voltage $V_{Out}$, a level of an output $V_{co}$ of the comparator circuit 71 becomes low. When the sawtooth waveform voltage $V_{Saw}$ is equal to or lower than the signal voltage $V_{Out}$, the level of the output $V_{co}$ becomes high.

The up/down counter 72 is an asynchronous counter, and the clock signal CK is applied from the timing control unit 58 under the control by the control signal $CS_1$ applied from the timing control unit 58. The up/down counter 72 measures a comparison period by down counting (DOWN)/up counting (UP) in synchronization with the clock signal CK. The comparison period is from the start of a comparison operation by the comparator circuit 71 to the end of the comparison operation.

The transfer switch 73 is turned to be ON (closed) at the time when the count operation of the pixel 40 in a certain row is completed by the up/down counter 72 under the control by the control signal $CS_2$ applied from the timing control unit 58. The transfer switch 73 transfers the count result by the up/down counter 72 to the memory device 74.

In this way, the comparator circuit 71 in each A/D conversion circuit 63 ($63_1$ to $63_m$) performs the comparison operation to the analog signal which is supplied from each pixel 40 of the pixel array unit 51 via the column signal lines $62_1$ to $62_m$ for each pixel column. The up/down counter 72 performs the count operation from the start of the comparison operation by the comparator circuit 71 to the end of the comparison operation so that the analog signal is converted into the digital signal and is stored in the memory device 74.

The column scanning unit 56 includes a shift register, an address decoder, and the like and performs control to a column address and column scanning of the A/D conversion circuits $63_1$ to $63_m$ in the column processing unit 54. Under the control by the column scanning unit 56, the digital signals which are A/D converted by the respective A/D conversion circuits $63_1$ to $63_m$ are read by the horizontal output line 57 in order and are output as image data via the horizontal output line 57.

In the above example, regarding the column processing unit 54, the structure is described in which the A/D conversion circuit 63 is provided for each column signal line 62 in a one-to-one correspondence relation. However, the arrangement of the A/D conversion circuit 63 is not limited to the one-to-one correspondence relation. For example, a structure can be employed in which the single A/D conversion circuit 63 is shared by the plurality of pixel columns and is used by the pixel columns in time division.

[Pixel Structure]

Figure 12:
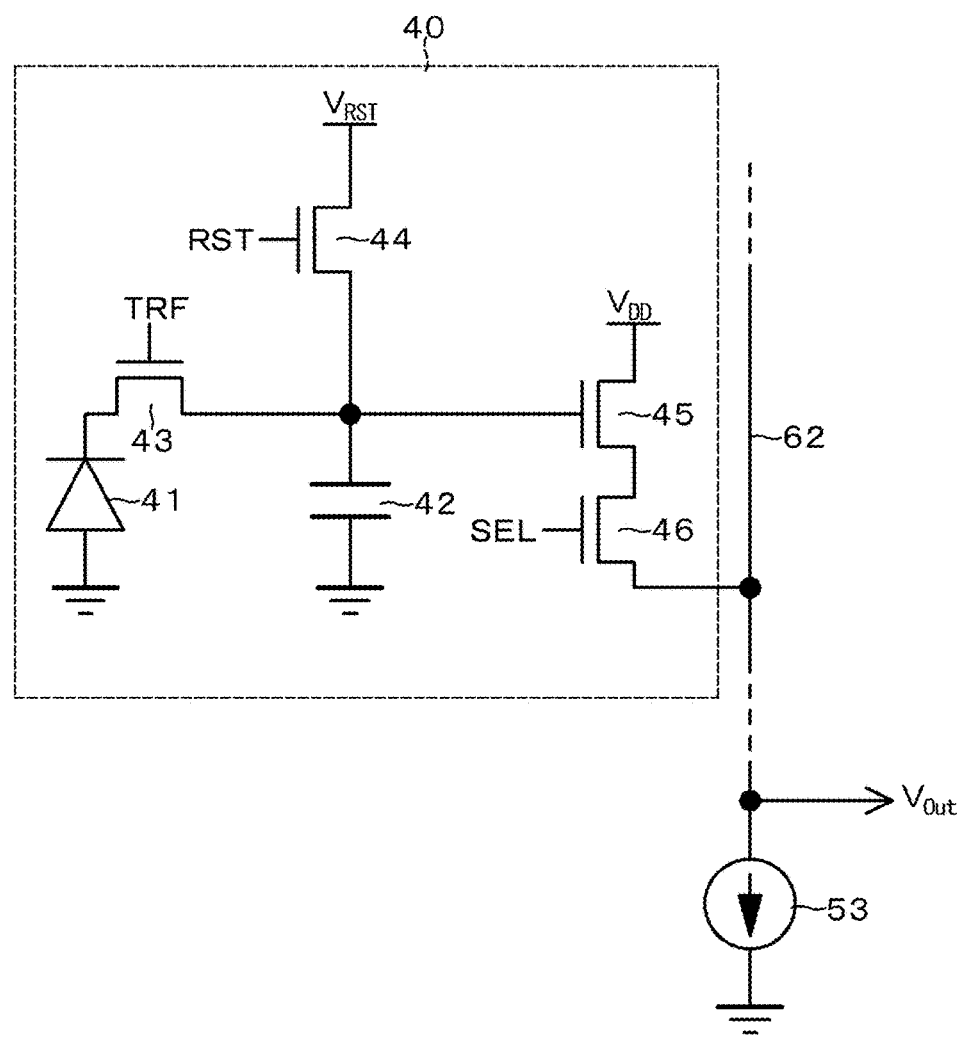
FIG. 12 is a circuit diagram of an exemplary pixel structure of the solid-state imaging device.

An exemplary structure of the pixel 40 is illustrated in FIG. 12. As illustrated in FIG. 12, the pixel 40 according to the present embodiment includes, for example, a photodiode 41 as a photoelectric converter. In addition to the photodiode 41, for example, the pixel 40 includes a charge/voltage converting unit 42, a transfer transistor (transfer gate) 43, a reset transistor 44, an amplifier transistor 45, and a selection transistor 46.

Here, for example, an N channel MOS transistor is used as the transfer transistor 43, the reset transistor 44, the amplifier transistor 45, and the selection transistor 46. However, a combination of the conductive types of the transfer transistor 43, the reset transistor 44, the amplifier transistor 45, and the selection transistor 46 described above is only exemplary. The combination is not limited to this.

A plurality of control lines is arranged to each pixel 40 in the same pixel row in common as the row control lines 61 ($61_1$ to $61_n$) described above. To simplify the figure, the plurality of control lines is not shown in FIG. 12. The plurality of control lines is connected to the output end corresponding to each pixel row of the row scanning unit 52 in pixel row unit. The row scanning unit 52 appropriately outputs a transfer signal TRG, a reset signal RST, and a selection signal SEL to the plurality of control lines.

An anode electrode of the photodiode 41 is connected to the power supply on the low potential side (for example, ground GND). The photodiode 41 photoelectrically converts the received light into the photoelectric charges (here, photoelectron) having a charge amount according to the amount of the received light and accumulates the photoelectric charges. A cathode electrode of the photodiode 41 is electrically connected to a gate electrode of the amplifier transistor 45 via the transfer transistor 43.

A region electrically connected to the gate electrode of the amplifier transistor 45 is the charge/voltage converting unit 42 for converting the charge into the voltage. The charge/voltage converting unit 42 is referred to as a floating diffusion/floating diffusion region/impurity diffusing region (FD) unit 42 below.

The transfer transistor 43 is connected between the cathode electrode of the photodiode 41 and the FD unit 42. The transfer signal TRG of which the high level (for example, $V_{DD}$ level) is active (referred to as "High-active" below) is applied from the row scanning unit 13 to the gate electrode of the transfer transistor 43. The transfer transistor 43 responses to the transfer signal TRG and is in the conductive state so that the transfer signal TRG is photoelectrically converted by the photodiode 41, and the accumulated photoelectric charges are transferred to the FD unit 42.

A drain electrode of the reset transistor 44 is connected to a reset power supply $V_{RST}$, and a source electrode is connected to the FD unit 42. The High-active reset signal RST is applied from the row scanning unit 52 to the gate electrode of the reset transistor 44. The reset transistor 44 responses to the reset signal RST and is in the conductive state and resets the FD unit 42 by throwing out the charge of the FD unit 42 to the reset power supply $V_{RST}$.

The gate electrode of the amplifier transistor 45 is connected to the FD unit 42, and the drain electrode is connected to the pixel power supply $V_{DD}$. The amplifier transistor 45 is an input unit of a source follower which is a read circuit for reading the signal obtained by the photoelectric conversion by the photodiode 41. That is, the source electrode of the amplifier transistor 45 is connected to the column signal line 22 via the selection transistor 46 so as to form the current sources 53 ($53_1$ to $53_m$) and the source follower connected to one end of the column signal line 22.

For example, a drain electrode of the selection transistor 46 is connected to the source electrode of the amplifier transistor 45, and a source electrode is connected to the column signal line 62. The High-active selection signal SEL is applied from the row scanning unit 52 to the gate electrode of the selection transistor 46. The selection transistor 46 responses to the selection signal SEL and is in the conductive state so as to turn the state of the pixel 40 into a selection state and to transmit the signal output from the amplifier transistor 45 to the column signal line 62.

The selection transistor 46 can employ a circuit structure connected between the pixel power supply $V_{DD}$ and the drain electrode of the amplifier transistor 45. Also, the pixel 40 is not limited to the one having the 4Tr pixel structure described above. For example, a 3Tr pixel structure may be employed in which the selection transistor 46 is omitted and the amplifier transistor 45 has the function of the selection transistor 46.

As described above, in the third embodiment, the technique of the light emitting device driving circuit 1 according to the first embodiment is applied to the A/D conversion circuits 63 ($63_1$ to $63_m$) in the column parallel A/D conversion system CMOS image sensor. That is, the sawtooth waveform generating unit 55 ($55_1$ to $55_m$) is provided for each pixel column of the pixel array unit 51 corresponding to each A/D conversion circuit 63 ($63_1$ to $63_m$). The sawtooth waveform generating unit 55 generates the sawtooth waveform voltage $V_{Saw}$ based on the two reference signals $V_{Saw\_1}$ and $V_{Saw\_2}$ for each pixel column.

In this way, by applying the technique of the light emitting device driving circuit 1 according to the first embodiment to the A/D conversion circuits 63 ($63_1$ to $63_m$), it is not necessary to transmit the sawtooth waveform voltage $V_{Saw}$ along the pixel row. Therefore, since the distortion of the waveform of the front end part of the sawtooth waveform voltage $V_{Saw}$ caused by the influence of the impedance of the transmission wiring can be prevented, the A/D conversion circuit 63 can realize a more accurate A/D conversion operation.

In the present embodiment, the technique of the light emitting device driving circuit 1 according to the first embodiment is applied to the A/D conversion circuits 63 in the column parallel A/D conversion system CMOS image sensor. However, the structure is not limited to this. That is, the technique of the light emitting device driving circuit 1 according to the first embodiment can be applied to a single A/D conversion circuit for using the sawtooth waveform voltage $V_{Saw}$ in which it is necessary to transmit the sawtooth waveform voltage $V_{Saw}$ over a distance long enough for generating the distortion of the waveform by the influence of the impedance of the transmission wiring and the like.

In the first to third embodiments described above, the two reference signals $V_{Saw\_1}$ and $V_{Saw\_2}$ are used as the sawtooth waveform signal to be the reference to generate the sawtooth waveform voltage $V_{Saw}$. However, the reference signal is not limited to the two reference signals $V_{Saw\_1}$ and $V_{Saw\_2}$. However, in order to minimize the number of wiring for transmitting the reference signal, it is preferable to generate the sawtooth waveform voltage $V_{Saw}$ based on the two reference signals $V_{Saw\_1}$ and $V_{Saw\_2}$.

The present disclosure can employ the following structure.

[1] A light emitting device driving circuit including;
a sawtooth waveform generating unit which generates a sawtooth waveform voltage having a sawtooth waveform voltage change based on at least two reference signals to be input; and
a comparison unit which compares an analog signal voltage with the sawtooth waveform voltage, wherein
a light emitting device is driven based on the comparison result of the comparison unit.

[2] The light emitting device driving circuit according to [1], wherein
the at least two reference signals are sawtooth waveform signals of which a voltage is more gently changed than the sawtooth waveform voltage.

[3] The light emitting device driving circuit according to [2], wherein
the at least two reference signals are signals having frequencies lower than that of the sawtooth waveform voltage.

[4] The light emitting device driving circuit according to [2] or [3], wherein
the at least two reference signals have the same frequencies.

[5] The light emitting device driving circuit according to any one of [2] to [4], wherein
the two reference signals are signals having similar forms in which waveforms are inverted in a time axis direction, and partial waveforms of the two reference signals are overlapped with each other.

[6] The light emitting device driving circuit according to [5], wherein
the sawtooth waveform generating unit generates the sawtooth waveform voltage based on the overlapped sharp waveform parts of the two reference signals.

[7] The light emitting device driving circuit according to [6], wherein
the sawtooth waveform generating unit includes a differential circuit which obtains a difference between the two reference signals and a cut-off unit which cuts off a waveform part of one of the two reference signals based on a signal having the same phase as one output signal of the differential circuit and cuts off a waveform part of the other one of two reference signals based on a signal having the reversed phase from the one output signal of the differential circuit, and
two waveform parts cut off by the cut-off unit are synthesized and form the sawtooth waveform voltage.

[8] The light emitting device driving circuit according to [7], wherein
the cut-off unit cuts off sharp waveform parts of the two reference signals.

[9] A display including:
a plurality of pixels which includes a light emitting unit and a drive circuit for driving the light emitting unit and is arranged in a two-dimensional matrix state, wherein
the drive circuit includes a sawtooth waveform generating unit which generates a sawtooth waveform voltage having a sawtooth waveform voltage change based on at least two reference signals to be input and a comparison unit which compares an analog signal voltage with the sawtooth waveform voltage, and
the light emitting unit is driven based on the comparison result of the comparison unit.

[10] The display according to [9], including:
a first input terminal which inputs one of the two reference signals when the sawtooth waveform voltage is generated; and
a second input terminal which inputs a predetermined voltage when an analog signal voltage is written and inputs the other one of the two reference signals when the sawtooth waveform voltage is generated.

[11] The display according to [10], wherein
the predetermined voltage is a voltage which is not used when the light emitting unit emits light.

[12] The display according to [11], wherein
the drive circuit includes a constant current source unit for supplying a constant current to the light emitting unit, and
the predetermined voltage is a reference voltage used to determine the constant current by the constant current source unit.

[13] The display according to any one of [9] to [2], wherein
the light emitting unit is formed of a light emitting diode.

[14] An A/D conversion circuit including:
a sawtooth waveform generating unit which generates a sawtooth waveform voltage having a sawtooth waveform voltage change based on at least two reference signals to be input; and
a comparison unit which compares an analog signal voltage with the sawtooth waveform voltage, wherein
a digital signal is generated based on the comparison result of the comparison unit.

REFERENCE SIGNS LIST

1 Light emitting device driving circuit
2 Pixel
10 Light emitting unit
11 Sawtooth waveform generating unit
12 Comparison unit
13 Constant current source unit
20 Drive circuit
31 Display panel
32 Sawtooth waveform generating unit
33 Output buffer
40 Pixel
41 Photodiode
42 Charge/voltage converting unit
43 Transfer transistor (transfer gate)
44 Reset transistor
45 Amplifier transistor
46 Selection transistor
51 Pixel array unit
52 Row scanning unit
53 Current source 54 Column processing unit
55 ($55_1$ to $55_m$) Sawtooth waveform generating unit
56 Column scanning unit
57 Horizontal output line
58 Timing control unit
61 ($61_1$ to $61_n$) Row control line
62 ($62_1$ to $62_m$) Column signal line
63 ($63_1$ to $63_m$) A/D conversion circuit
71 Comparator circuit
72 Up/down counter
73 Transfer switch
74 Memory device
101 Scanning unit
102 Video signal outputting unit
111, 121 Differential circuit
112, 113, 125, 126 Inverter circuit
114 Cut-off unit
122, 123, 124 Current mirror circuit
201 to 205 Input terminal
301 First input terminal
302 Second input terminal
303 Third input terminal
$TR_{Drv}$ Light emitting unit driving transistor
$P_{Drv}$ Driving pulse
$V_{Gate}$ Scanning signal
$V_{Saw\_1}$, $V_{Saw\_2}$ Reference signal
$V_{Sig}$ Signal voltage of analog video signal
$V_{aw}$ Sawtooth waveform voltage
$V_{Ref}$, $I_{Ref}$ Reference voltage

The invention claimed is:

1. A driving circuit for driving a light emitting device, comprising;
  a sawtooth waveform generating unit configured to generate a sawtooth waveform voltage having a sawtooth waveform voltage change based on at least two reference signals to be input; and
  a comparison unit configured to compare an analog signal voltage with the sawtooth waveform voltage, wherein
  the light emitting device is driven based on a comparison result of the comparison unit and wherein the at least two reference signals are sawtooth waveform signals of which a voltage is more slowly changed than the sawtooth waveform voltage.

2. The driving circuit according to claim 1, wherein the at least two reference signals are signals having frequencies lower than that of the sawtooth waveform voltage.

3. The driving circuit according to claim 1, wherein the at least two reference signals have the same frequencies.

4. The driving circuit according to claim 1, wherein the two reference signals are signals having similar forms in which waveforms are inverted in a time axis direction, and partial waveforms of the two reference signals are overlapped with each other.

5. The driving circuit according to claim 4, wherein the sawtooth waveform generating unit generates the sawtooth waveform voltage based on the overlapped sharp waveform parts of the two reference signals.

6. The driving circuit according to claim 5, wherein the sawtooth waveform generating unit includes a differential circuit which obtains a difference between the two reference signals and a cut-off unit which cuts off a waveform part of one of the two reference signals based on a signal having the same phase as one output signal of the differential circuit and cuts off a waveform part of the other one of two reference signals based on a signal having the reversed phase from the one output signal of the differential circuit, and
  two waveform parts cut off by the cut-off unit are synthesized and form the sawtooth waveform voltage.

7. The driving circuit according to claim 6, wherein the cut-off unit cuts off sharp waveform parts of the two reference signals.

8. A display comprising:
  a plurality of pixels configured to include a light emitting unit and a drive circuit for driving the light emitting unit and to be arranged in a two-dimensional matrix state, wherein
  the drive circuit includes a sawtooth waveform generating unit which generates a sawtooth waveform voltage having a sawtooth waveform voltage change based on at least two reference signals to be input and a comparison unit which compares an analog signal voltage with the sawtooth waveform voltage, and
  the light emitting unit is driven based on a comparison result of the comparison unit and wherein the at least two reference signals are sawtooth waveform signals of which a voltage is more slowly changed than the sawtooth waveform voltage.

9. The display according to claim 8, comprising:
  a first input terminal configured to input one of the two reference signals when the sawtooth waveform voltage is generated; and
  a second input terminal configured to input a predetermined voltage when an analog signal voltage is written and input the other one of the two reference signals when the sawtooth waveform voltage is generated.

10. The display according to claim 9, wherein the predetermined voltage is a voltage which is not used when the light emitting unit emits light.

11. The display according to claim 10, wherein the drive circuit includes a constant current source unit for supplying a constant current to the light emitting unit, and
  the predetermined voltage is a reference voltage used to determine the constant current by the constant current source unit.

12. The display according to claim 8, wherein the light emitting unit is formed of a light emitting diode.

13. An A/D conversion circuit comprising:
  a sawtooth waveform generating unit configured to generate a sawtooth waveform voltage having a sawtooth waveform voltage change based on at least two reference signals to be input; and
  a comparison unit configured to compare an analog signal voltage with the sawtooth waveform voltage, wherein
  a digital signal is generated based on a comparison result of the comparison unit and wherein the at least two reference signals are sawtooth waveform signals of which a voltage is more slowly changed than the sawtooth waveform voltage.

* * * * *